(12) United States Patent
Scelzi

(10) Patent No.: US 10,452,090 B2
(45) Date of Patent: *Oct. 22, 2019

(54) CONTROLLING BUILDING SYSTEMS

(71) Applicant: NetESCO LLC, Glen Allen, VA (US)

(72) Inventor: Michael Craig Scelzi, Glen Allen, VA (US)

(73) Assignee: NetESCO LLC, Glen Allen, VA (US)

( * ) Notice: Subject to any disclaimer, the term of this patent is extended or adjusted under 35 U.S.C. 154(b) by 239 days.

This patent is subject to a terminal disclaimer.

(21) Appl. No.: 15/258,160

(22) Filed: Sep. 7, 2016

(65) Prior Publication Data

US 2016/0378127 A1 Dec. 29, 2016

Related U.S. Application Data

(63) Continuation of application No. 13/800,831, filed on Mar. 13, 2013, now Pat. No. 9,471,045, which is a
(Continued)

(51) Int. Cl.
*G01K 17/20* (2006.01)
*G01R 21/133* (2006.01)
(Continued)

(52) U.S. Cl.
CPC .............. *G05F 1/66* (2013.01); *G01K 17/20* (2013.01); *G01R 21/1333* (2013.01);
(Continued)

(58) Field of Classification Search
CPC .... G01K 17/20; G01R 21/1333; G05B 11/01; G05B 2219/2642; G05F 1/66;
(Continued)

(56) References Cited

U.S. PATENT DOCUMENTS 4,206,872 A 6/1980 Levine
4,215,408 A 7/1980 Games et al.
(Continued)

FOREIGN PATENT DOCUMENTS

DE 102006049717 B3 4/2008

OTHER PUBLICATIONS

May 3, 2018 (US) Non-Final Office Action—U.S. Appl. No. 14/492,442.
(Continued)

*Primary Examiner* — Abdelmoniem I Elamin
(74) *Attorney, Agent, or Firm* — Banner & Witcoff, Ltd.

(57) ABSTRACT

Methods, apparatus, and systems are provided for measuring the supply of a consumable product to a facility over time and analyzing the measurements to determine the consumption or supply of the product by one or more loads and/or sources in the facility, and to determine induced and residual heat flow through the facility's envelope. Various aspects compare the measured supply of the consumable product to a database of consumption signatures. Operating conditions and facility characteristics may be further considered in determining a particular user's access of the consumable product. Thermal resistance factors of the building may be determined, which are based on the induced and residual heat flow through the facility. Finally, one or more signatures of a building system are analyzed to determine a building's overall efficiency, including determining a controllable load of a building and/or determining an efficient start time for one or more building systems.

5 Claims, 18 Drawing Sheets

Related U.S. Application Data continuation of application No. 12/960,149, filed on Dec. 3, 2010, now Pat. No. 8,843,416, which is a continuation-in-part of application No. 12/557,992, filed on Sep. 11, 2009, now abandoned.

(51) Int. Cl.

| | | |
|---|---|---|
| G05F 1/66 | (2006.01) | |
| G06Q 30/00 | (2012.01) | |
| G05B 11/01 | (2006.01) | |
| G06Q 50/06 | (2012.01) | |
| G06Q 10/00 | (2012.01) | |

(52) U.S. Cl.
CPC ............ *G05B 11/01* (2013.01); *G06Q 10/00* (2013.01); *G06Q 30/018* (2013.01); *G06Q 50/06* (2013.01); *G05B 2219/2642* (2013.01); *Y02P 90/84* (2015.11); *Y04S 10/54* (2013.01)

(58) Field of Classification Search
CPC ...... G06Q 10/00; G06Q 30/018; G06Q 50/06; Y02P 90/84; Y04S 10/54
See application file for complete search history.

(56) References Cited

U.S. PATENT DOCUMENTS

| | | | |
|---|---|---|---|
| 4,228,511 A | 10/1980 | Simcoe et al. | |
| 4,409,889 A | 10/1983 | Burleson | |
| 4,438,394 A | 3/1984 | Ekdahl | |
| 4,647,221 A | 3/1987 | Szabo | |
| 4,674,027 A | 6/1987 | Beckey | |
| 4,706,882 A | 11/1987 | Barnard | |
| 4,725,001 A | 2/1988 | Carney et al. | |
| 5,088,645 A | 2/1992 | Bell | |
| 5,126,932 A | 6/1992 | Wolfson et al. | |
| 5,197,666 A | 3/1993 | Wedekind | |
| 5,416,781 A | 5/1995 | Ruiz | |
| 5,423,396 A | 6/1995 | Fahrion | |
| 5,453,681 A | 9/1995 | Berkcan et al. | |
| 5,544,036 A | 8/1996 | Brown, Jr. et al. | |
| 5,555,927 A | 9/1996 | Shah | |
| 5,703,442 A | 12/1997 | Notohamiprodjo et al. | |
| 5,761,083 A | 6/1998 | Brown, Jr. et al. | |
| 5,924,486 A | 7/1999 | Ehlers et al. | |
| 6,095,235 A | 8/2000 | Kongsgaard | |
| 6,132,082 A | 10/2000 | Pause | |
| 6,581,846 B1 | 6/2003 | Rosen | |
| 6,603,218 B1 | 8/2003 | Aisa | |
| 6,622,097 B2 | 9/2003 | Hunter | |
| 6,657,552 B2 | 12/2003 | Belski et al. | |
| 6,785,592 B1 | 8/2004 | Smith et al. | |
| 6,819,098 B2 | 11/2004 | Villicana et al. | |
| 6,944,555 B2 | 9/2005 | Blackett et al. | |
| 7,373,221 B2 | 5/2008 | Lal | |
| 7,406,436 B1 | 7/2008 | Reisman | |
| 8,186,873 B1 | 5/2012 | Madding | |
| 8,791,417 B2 | 7/2014 | Scelzi et al. | |
| 8,843,416 B2 | 9/2014 | Scelzi et al. | |
| 9,471,045 B2* | 10/2016 | Scelzi .................... G06Q 10/00 | |
| 2002/0134541 A1 | 9/2002 | Nelson | |
| 2003/0016730 A1 | 1/2003 | Daily et al. | |
| 2003/0171851 A1 | 9/2003 | Brickfield et al. | |
| 2003/0214399 A1 | 11/2003 | Naruse et al. | |
| 2003/0225483 A1 | 12/2003 | Santinato et al. | |
| 2004/0239494 A1 | 12/2004 | Kennedy et al. | |
| 2005/0103767 A1 | 5/2005 | Kainec et al. | |
| 2005/0107892 A1* | 5/2005 | Matsui .................... H02J 3/14 | |
| | | | 700/28 |
| 2005/0154898 A1 | 7/2005 | Chao | |
| 2006/0047480 A1 | 3/2006 | Lenz et al. | |
| 2006/0167591 A1 | 7/2006 | McNally | |
| 2006/0209857 A1 | 9/2006 | Hicks | |
| 2007/0006329 A1 | 1/2007 | Morrow et al. | |
| 2007/0055640 A1 | 3/2007 | Dababneh et al. | |
| 2007/0118739 A1 | 5/2007 | Togashi et al. | |
| 2007/0235550 A1 | 10/2007 | Donath et al. | |
| 2008/0003346 A1 | 1/2008 | Boyer et al. | |
| 2008/0082183 A1 | 4/2008 | Judge | |
| 2008/0092644 A1 | 4/2008 | Hasebe | |
| 2008/0147465 A1 | 6/2008 | Raines et al. | |
| 2008/0159616 A1 | 7/2008 | Fellinger | |
| 2009/0018705 A1* | 1/2009 | Ouchi ....................... H02J 3/14 | |
| | | | 700/291 |
| 2009/0030712 A1 | 1/2009 | Bogolea et al. | |
| 2009/0083167 A1 | 3/2009 | Subbloie | |
| 2009/0187499 A1 | 7/2009 | Mulder et al. | |
| 2009/0195349 A1 | 8/2009 | Frader-Thompson et al. | |
| 2009/0234511 A1* | 9/2009 | Ouchi ....................... H02J 3/14 | |
| | | | 700/291 |
| 2009/0240380 A1 | 9/2009 | Shah et al. | |
| 2009/0307573 A1 | 12/2009 | Lavelle et al. | |
| 2009/0319905 A1 | 12/2009 | Loeb et al. | |
| 2010/0023239 A1 | 1/2010 | Self et al. | |
| 2010/0043870 A1 | 2/2010 | Bennett et al. | |
| 2010/0061420 A1 | 3/2010 | Parks | |
| 2010/0100253 A1 | 4/2010 | Fausak et al. | |
| 2010/0169139 A1 | 7/2010 | Koenig-Richardson | |
| 2010/0211222 A1 | 8/2010 | Ghosn | |
| 2010/0280978 A1 | 11/2010 | Shimada et al. | |
| 2010/0324962 A1 | 12/2010 | Nesler et al. | |
| 2010/0332044 A1 | 12/2010 | McLean | |
| 2011/0004764 A1 | 1/2011 | Stuber | |
| 2011/0178610 A1 | 7/2011 | O'Connor et al. | |
| 2011/0178977 A1 | 7/2011 | Drees | |
| 2012/0065789 A1 | 3/2012 | Scelzi et al. | |
| 2012/0085831 A1 | 4/2012 | Kopp | |
| 2012/0280827 A1* | 11/2012 | Kashiwagi ............. G05B 15/02 | |
| | | | 340/691.6 |
| 2012/0306882 A1* | 12/2012 | Kashiwagi ............... G01D 4/00 | |
| | | | 345/440 |
| 2015/0269587 A1* | 9/2015 | Swaminathan ...... G06Q 30/016 | |
| | | | 705/304 |
| 2016/0035113 A1* | 2/2016 | Kashiwagi ............... G01D 4/00 | |
| | | | 345/440 |
| 2016/0348932 A1* | 12/2016 | Tamaru ................ G01R 22/061 | |
| 2018/0151946 A1* | 5/2018 | Grohman .................. H02J 3/14 | |

OTHER PUBLICATIONS

U.S. Appl. No. 12/960,149, Office Action dated Apr. 3, 2013, issued in related case.

Zhu et al., Detailed energy saving performance analyses on thermal mass walls demonstrated in a zero energy house, Mar. 2009, Energy and Buildings, vol. 41, Issue 3, pp. 303-310.

Cabeza et al., Experimental study on the performance of insulation materials in Mediterranean construction, May 2010, Energy and Buildings, vol. 42, Issue 5, pp. 630-636.

Nov. 15, 2013 European Search Report issued in European Application No. 11191905.6.

Non-Final Office Action issued in related U.S. Appl. No. 14/335,194 dated Oct. 6, 2014.

Olutimayin et al., Measuring and modeling vapor boundary layer growth during transient diffusion heat and moisture transfer in cellulose insulation, Jul. 2005, vol. 48, Issue 16, pp. 3319-3330.

Final Office Action issued in related U.S. Appl. No. 14/335,194 dated Feb. 13, 2015.

Wolcott, Michael P, Formulation and process development of flat-pressed wood-polyethylene composites, Sep. 2003, Forest Products Journal, vol. 53, Issue 9, pp. 25-32.

Non-Final Office Action issued in related U.S. Appl. No. 13/446,286 dated May 27, 2015.

Non-Final Office Action issued in related U.S. Appl. No. 13/800,831 dated Jun. 4, 2015.

Aug. 1, 2013 (US) Non-Final Office Action—U.S. Appl. No. 12/960,149.

Aug. 6, 2012 (US) Non-Final Office Action—U.S. Appl. No. 12/960,149.

Jul. 7, 2016 (US) Non-Final Office Action—U.S. Appl. No. 13/446,286.
Oct. 5, 2015 (US) Final Office Action—U.S Appl. No. 13/446,286.

(56) References Cited

OTHER PUBLICATIONS

Dec. 29, 2014 (US) Non-Final Office Action—U.S. Appl. No. 13/446,286.
Dec. 31, 2013 (US) Final Office Action—U.S. Appl. No. 13/446,290.
Aug. 1, 2013 (US) Non-Final Office Action—U.S. Appl. No. 13/446,290.
Feb. 19, 2016 (US) Non-Final Office Action—U.S. Appl. No. 13/800,831.
Jun. 1985—Birdsall et al., "Overview of the DOE-2 Building Energy Analysis Program, Version 2.1D" Lawrence Berkeley National Laboratory.

* cited by examiner

CONTROLLING BUILDING SYSTEMS

This application is continuation of U.S. patent application Ser. No. 13/800,831 entitled Controlling Building Systems, filed Mar. 13, 2013, now U.S. Pat. No. 9,471,045, which is a continuation-in-part of U.S. patent application Ser. No. 12/960,149, entitled Determining Energy Consumption in a Structure, filed Dec. 3, 2010, now U.S. Pat. No. 8,843,416, which is a continuation-in-part of U.S. patent application Ser. No. 12/557,992, entitled Determining Consumption and/or Generation of Consumable Products in a Distributed System, filed Sep. 11, 2009, now abandoned. Each application is herein incorporated by reference in its entirety.

FIELD OF THE DISCLOSURE

Aspects relate generally to measuring consumption and production of a consumable product in a distribution system by one or more loads and/or sources. Further aspects relate generally to measuring energy efficiency of buildings via direct measurements as opposed to calculated theoretical measurements and/or utilizing these direct measurements in incentive based construction contracts. Methods, apparatus, and systems are disclosed which determine access to the consumable product (e.g., electricity) by a particular load or source in the distribution system through the use of techniques which characterize consumption/generation of the consumable product by one or more of the loads or sources. The methods, apparatus, and systems further provide real time monitoring of environmental conditions and usage of a building to characterize the building's current and historical energy performance and/or R-value.

BACKGROUND

Utility costs represent one of the largest expenses effecting net operating cost of residential, commercial, and industrial facilities. For example, a large office building comprised of 60,000 square feet will have an electrical consumption of approximately $10,000 monthly in the Mid Atlantic states in the summer months. Knowing how a building is being utilized by its tenants and knowing the building energy performance are both factors in understanding and controlling these costs.

SUMMARY

With respect to building utilization, tenants are constantly connecting electrical consumption devices including servers and other electric equipment not only to dedicated tenant lines but also to building power lines. Being able to recover this cost from tenants of the facility is critical to maximizing value, maximizing loan capacity of the facility, and maximizing revenue stream generated from the facility. However, being able to accurately match the consumption of utilities such as electrical power to individual tenants and/or buildings is often difficult. Further, some tenants and/or buildings will provide for generation of power for input into a smart grid. These generation facilities may include, for example, solar panels and/or wind generation facilities located proximate to buildings such as on top of buildings. There is a need to account for these installations. Additionally, electrical power, which is distributed to a number of tenants, may be provided to a facility with one supply service measured by one meter. To recover the cost of the electrical power, the facility manager may have to install costly additional supply services and meters or retro-fit the electrical distribution system in the facility such that each tenants electrical usage can be measured individually. Alternatively, the cost of the utility may be averaged and allocated to each tenant equally.

Situations may arise where one tenant consumes a disproportionate amount of the utility. For example, a particular tenant may install high powered add-on equipment such as computer server rooms, laboratory systems, or cellular network towers. In such cases, the facility operator may find that averaging the utility cost across all of the tenants may push the facility's fixed cost per square-foot to be greater than the facility's value per square-foot.

Building systems lack a simple understandable method for tracking the utility consumption. Due to the inability to simply track the consumption, building automation systems are often removed from service, electrically jumpered out of the distribution system, adjusted to extend start and stop times beyond optimal settings, not adjusted to reflect changes in the hours of occupancy from the original lease schedule, etc., and thus, the facility consumes more energy due to inadequate controls and monitoring. One technique to monitor and control the consumption is, for example, a graphical user interface which may be variously configured. In exemplary embodiments, it may be configured to compare historical values (as for example adjusted for outside temperature) with current values. The graphical user interface may employ an appropriate algorithm and graphical representations showing deviations which likely indicate either a problem or new energy usage by a particular tenant.

Another factor in controlling energy costs is understanding the thermal performance of the building's envelope (i.e., structure). Improving energy efficiency in new construction and in the remodeling of existing structures has become a primary concern, which is driven by such factors as utility costs, public concern for the environment and human health, government regulation, corporate social responsibility, globalization, and other market forces. In response to this concern, industry groups have formed, which put forth efficiency guidelines and certification programs for builders to follow. These certifications and other design benchmarks require energy efficiency to be addressed early in the design and construction process.

These requirements and verifications typical are based on simulation of building models, and an as-built structure may not, and often does not, meet the energy performance requirements of the planned design on day-one after completion. The errors in the simulation may be caused by design variations that are not reflected in the model, construction of the structure which is not to specification, incorrect assumptions on building usage and weather, utility equipment which is not installed correctly or functioning according to specification, insufficient model fidelity, and numerous other factors. Further, a building's energy performance may change over time due to the aging of materials, modifications to building structures and systems, or damage to the structures and systems.

Currently, no means exist to comprehensively measure a building's actual energy performance or to monitor the energy performance over time. Thus, the verification and management of a building's designed energy efficiency is based on incomplete or inaccurate information.

To overcome these problems described above and other problems, methods and systems are needed to determine the use of a utility by individual tenants, and to provide comprehensive in-situ measurement of a building's actual energy performance. These techniques allow building developers to insert incentive provisions in their contracts to ensure that buildings actually meet their design requirements. The end result may be specified without micromanaging the building process. This allows the building process to proceed as efficiently as possible and allows new technologies to be easily integrated without renegotiating the overall contract.

This Summary is provided to introduce a selection of concepts in a simplified form that are further described below in the Detailed Description. This Summary is not intended to identify key features or essential features of the invention.

Various techniques are presented for measuring the supply of a consumable product, such as electrical power, to a facility over time and analyzing the measurements to determine the consumption or supply of the product by one or more loads and/or sources (i.e. users) in the facility. Various aspects compare the measured supply of the consumable product to a database of signatures, and/or lease schedules which characterize access to the consumable product by particular users. In one exemplary embodiment, the supply of consumable product to the HVAC system may be measured and analyzed as compared to the inside temperature, outside temperature, sun loading, and heat generated by other devices such as lighting and computers to determine the overall R-value of a building.

The various techniques may be used, for example, in facilities to provide detailed reports of the usage of utilities such as electrical power, gas, and water, by multiple different users connected to a common measurable supply of the product. In doing so, the various techniques may be used to more accurately divide the cost of such utilities between different tenants of the facility without having to install individual services that can be individually measured for each tenant. In addition, by analyzing real time data and historical utility signatures the user can modify schedules to match leases, verify equipment operation either on/off, and verify large equipment loads by reviewing building utility signatures.

In a first embodiment, measurements are made from a common service, recorded as a data sequence, and transmitted to one or more processors for analyses. The processor(s) may retrieve signatures from a database to analyze various parameters such as the data sequences and determine, for example, different parameters such as how much of the measured product is consumed or produced by one or more particular users within a group of users connected to the measured service. Reports may then be generated which detail the use and/or supply.

In other embodiments operating conditions of the various users in the facility are measured at the same time supply of the consumable product may be measured. These operating conditions may be stored and/or transmitted to the processor(s), and the processor(s) may be configured in various ways. In one configuration, the processors may use the operating conditions as additional data in determining the usage of the consumable product by one or more users. Operating conditions may include, for example, temperatures inside and outside of the facility, and/or the number of people in the facility. These parameters may be utilized to determine a base line and/or inform the building manager whenever the building varies from the baseline, potentially indicating an anomaly.

In another embodiment, artificial intelligence algorithms such as, for example, neural networks may be used in the analysis of the data sequences and/or signatures to determine the usage of one or more particular users. The artificial intelligence may develop and learn over time using both rule based input and learned input from a trained operator.

In other embodiments, the signatures may be created by monitoring the use and/or supply of the consumable product in the distribution system of a facility and comparing the monitored use and/or supply to measured or controlled operating conditions of users of the product within the facility. The signatures may be determined, for example, by training an artificial intelligence process such as a neural network with the measured supply and/or operating conditions.

Further techniques are presented for measuring induced and/or residual heat flow through a building envelope. Various illustrative induced heat flows include heat resulting from: electrical power flowing into a building and being converted to heat by the distribution system and by electrical loads; fuel such as natural gas flowing into the building to produce heat when used; water which flows into the building and carries heat by virtue of its thermal mass; climate control systems which mechanically move heat through the building; and people which dissipate heat while inside the building. Residual heat flow includes the passive heat transfer through the building structure which is induced by the difference in the environments within the building and outside of the building. These various induced and residual heat flows may be determined periodically and in real time.

In exemplary embodiments, the building may be qualified while minimizing the transient heat flows generated by people, water, and non-HVAC heat sources such as lights and computers. This qualification may take place both at initial building launch and after a set period of time such as after building buildout. Incentives may be built into the contract that are conditioned on meeting predetermined performance criteria, such as R-value criteria. These R-value criteria may be specified with and/or without transient heat flows minimized.

In various embodiments, the residual heat flow and thermal resistance of wall assemblies of the building are measured using embedded sensors within the wall and/or periodically using transportable sensors. In one embodiment, the sensors are embedded in the material making up a layer of the wall assembly by the manufacturer of that material layer. In another embodiment, a temperature probe is inserted through the layers of the wall, wherein the probe has the ability to sense multiple temperatures at incremental depths along the probe.

In further embodiments, a thermal resistance factor of the building envelope is determined based on the measured induced and/or residual heat flows. Thermal resistance factor, $R_C$, is often a composite measure of thermal performance of a building envelope. The thermal resistance factor may be determined statically, where some or all induced heat flow is cut off, and the inside and outside environments are monitored over time as they approach equilibrium with one another. In one aspect the thermal resistance factor is determined as the amount of time taken for equilibrium to be reached given predefined initial conditions. In another aspect, the thermal resistance factor is defined by the change in temperature over a given time period given at set of initial conditions.

In other embodiments, the thermal resistance factor may be determined dynamically, where induced heat flow and environmental conditions are periodically and/or continuously monitored in real time.

In various embodiments, the static or dynamic thermal resistance factors may be used in one or more additional processes. For example, in one embodiment, the process may utilize a one-time snapshot of thermal resistance factor and/or a thermal resistance factor determined repeatedly to capture changes in the thermal resistance factor over time. In embodiments, the method of determining a target thermal resistance factor and/or a required thermal resistance factor may be specified in a building contract as a design metric. In other embodiments, the specific methods for determining $R_C$ may be used as industry standards to compare different structures, or to establish minimum build criteria. In still other embodiments, the thermal resistance factor may be used along with measured or forecasted environment conditions in a closed loop system to control the climate control system of the building. For example, the closed loop system may further control the climate control system and/or other building systems based on utility usage by different users as determined above based on user signatures.

In various embodiments, the energy performance of a building is determined by analyzing a signature characterizing one or more building system's access to a consumable product. One or more metrics representing this energy performance may be determined in order to quantify the building's energy performance. For example, a controllable load, controllable load score, or building start time score may be determined. Further, in some embodiments a weighted energy score, which combines two or more of these metrics, may be determined. Finally, in some embodiments, a signature characterizing one or more building system's access to a consumable product may be used to determine an optimal ramp time and corresponding start time for a building system, such as an HVAC system.

Other various embodiments include systems, equipment, processes, and computer readable memory storing machine executable instructions for performing the functions of the embodiments described above.

BRIEF DESCRIPTION OF THE DRAWINGS

A more complete understanding of the disclosure and the advantages thereof may be acquired by referring to the following description in consideration of the accompanying figures, in which like reference numerals in different figures indicate similar elements, in which the first portion of each reference numeral corresponds to the figure number in which the referenced element is first introduced, and wherein.

DETAILED DESCRIPTION

In the following description of the various embodiments, reference is made to the accompanying drawings, which form a part hereof, and which are shown by way of illustration. It is to be understood that other embodiments may be utilized and structural and functional modifications may be made without departing from the scope of the disclosure.

Figure 1:
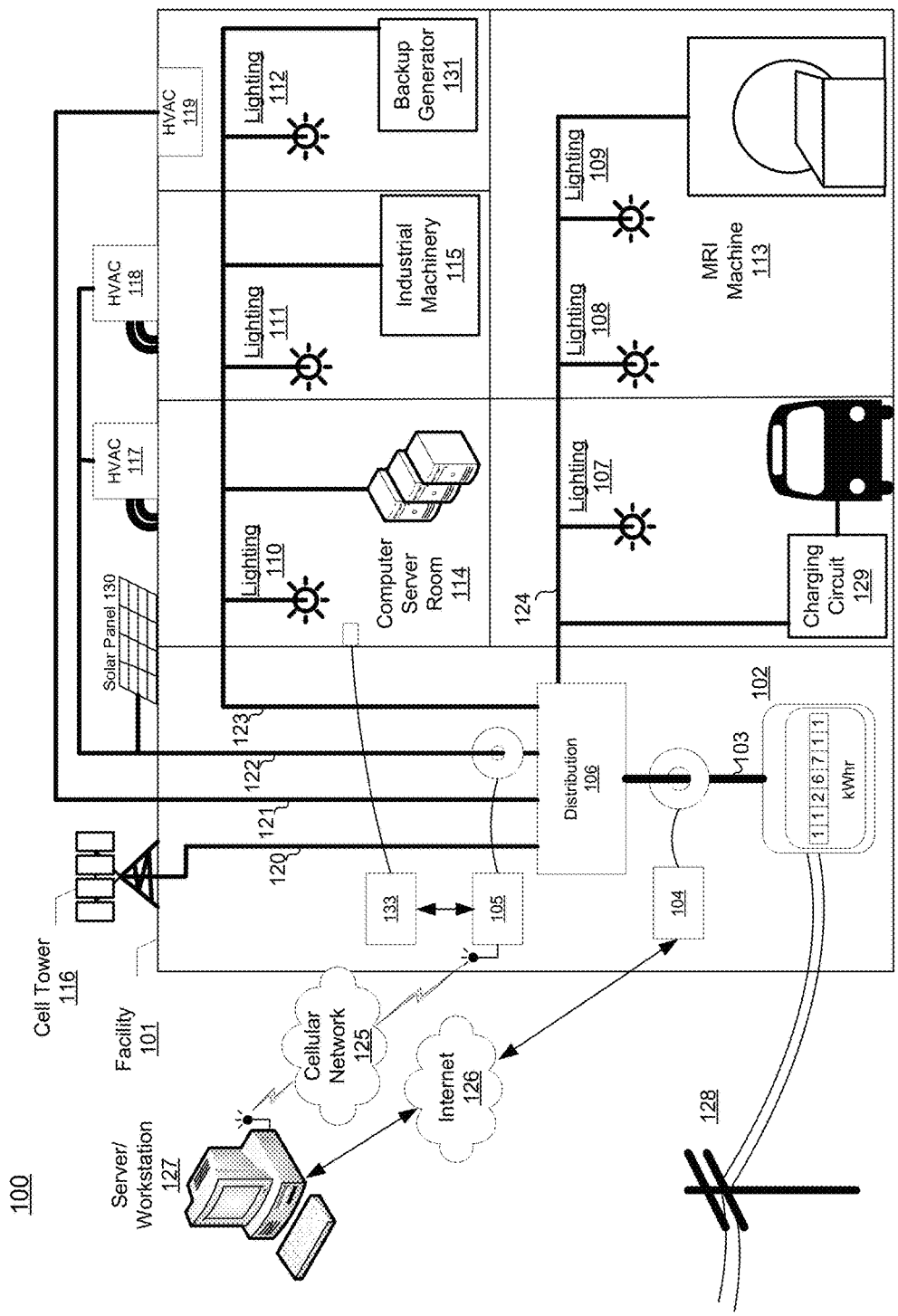
FIG. 1 illustrates an exemplary electrical distribution system of a facility in which various embodiments may be implemented.

FIG. 1 illustrates an exemplary system 100 in which various embodiments may be implemented. System 100 includes an electrical distribution system of a facility 101 in which electrical power is distributed as a consumable product to various electrical loads (i.e. users) connected to the distribution system. The facility may be commercial, residential, industrial, some combination thereof, or may be any other structure which contains a distribution system for the supply and/or generation of a consumable product. Exemplary facilities include apartment buildings, strip malls, office buildings, hospitals, industrial parks, etc.

A consumable product such as electrical power may be provided to facility 101 via any suitable source such as a public, private, and/or cooperative utility through transmission lines 128 or may be generated from on site sources such as solar panel 130, or back up generator 131. The utility may be provided as one supply feed 103 through a single meter 102, or may be supplied through several separate feeds and/or meters. Often, a single feed is split at a distribution point 106 into several separate distribution services 120-124, each of the services providing one or more different users access to the utility. Exemplary users may include loads typically found in facilities, including lighting 107-112 and/or heating, ventilation and/or air conditioning systems (HVACs) 117-119. Additional non-standard loads may also be connected to the distribution system depending on the particular use of the facility. Illustrative non-standard loads may include a computer server room 114, industrial machinery 115, medical equipment 113, and/or a cellular network tower 116. Additional exemplary non-standard loads may include charging circuits 129 in a garage associated with electric cars. Users may inductively or via a plug-in cable charge their electric cars while parked in the garage. These charges may be billed back to the individual parking tenant rather than distributed to all users in the building. Further, during peak periods, cars in the garage may be utilized to store and resource power back into the building and/or distribution network. Exemplary users may include producers of the consumable product that is put back into the distribution system for use by loads locally and/or for distribution back into the transmission lines 101. Such producers may include solar panels 130, back-up generators 131, batteries from electric cars, etc. which may be distributed about the building including on the sides, within the building, on the roof, and/or disposed around a building, cell tower, or other facility 101. These sources may be coupled to the distribution device 106 for use locally and/or input back into the system 100 via transmission lines 128.

Distribution systems may be designed to support specific users, and/or specific tenants of the facility who connect a specific group of users to the distribution system. The design of the distribution system may provide individual tenants and individual employees of the tenant their own supply feed, distribution service, and/or different combinations thereof such that use and/or generation of the consumable product by the individual tenant/employee may be uniquely measured using a meter on the tenant's/employee's supply feed or using a sub-meter on the tenant's distribution service. However, designing the distribution around specific tenants is not always accomplished or even possible. As requirements for the facility change, users of the consumable product may be added in an ad-hoc manner without accounting for how the consumable product is shared between the tenants.

In instances where access (consumption or production) to the consumable product by a specific user (load or producer), or group of users, needs to be measured on a supply feed or distribution service shared with other users, some embodiments may add a meter 104 or sub-meter 105 to a supply feed or distribution service respectively, to measure and record consumption or supply of the consumable product over time. From these measurements, analysis may be performed according to certain embodiments to determine access to the consumable product by the user, or group of users, of interest, from the total access by all the users on the measured supply feed or distribution service.

Meter 104 and sub-meter 105 may be variously configured. In one embodiment, meter 104 and sub-meter 105 may include one or more sensors coupled to the supply feed or distribution service used to measure the supply of the consumable product. Various sensors appropriate for measuring the consumption and/or supply of the consumable product will differ depending on the consumable product being measured. In an electrical distribution system in system 100, the sensor may be an inductively coupled transformer, a current shunt, or other appropriate sensor for measuring the consumable product such as power, electrical current and/or voltage. In other distribution systems for other consumable products such as natural gas and water, appropriate flow meters may be used. Meters 104 and 105 will further include a computing platform to operate the sensor, and accumulate pulse inputs (periodic measurements) from the sensors. Each meter may include several sensors and accumulate data from several different paths in the distribution system. As an example, meter 104 may include a circuit board with 10 sensor channels for sensors which may each collect pulse data in parallel. A processor on the circuit board may read each channel and accumulate data in the same and/or separate memory devices (e.g. registers) for each channel. The meter 104 may further have a data display which scrolls periodically and/or continuously to illustrate the pulses per channel. In addition to the data display, meter 104 may have buttons or other inputs which can be used for on-site programming and/or trouble shooting. After on-site programming/trouble shooting, further programming may be from a remote location and/or computer.

The meters may be variously configured. In some embodiments, the meters may transmit data (e.g., pulse data) to a different computing platform, such as server/workstation 127 via a private network (e.g., cellular network 125) and/or a public network (e.g., the Internet 126). The pulse data from one or more sensors may be individually transmitted, and/or may be grouped in any appropriate manner such as being totaled over a user defined and/or predefined and/or variable period and transmitted. The server/workstation 127 may further accumulate data from one and/or several different meters. Server/workstation 127 may be within the facility, collocated with the meters, or remote as illustrated in FIG. 1. Each meter and server/workstation may have one or more interfaces to one or more communication paths to transfer data between the meter and the server/workstation. Exemplary communication paths may include various public and private local area networks (LAN) and wide area networks (WAN), etc., over various physical networks, including voice band and digital subscriber line (DSL) modems on public switched telephone networks (PSTN), cable and fiber-optic modems and networks, cellular phone networks, satellite networks, Wifi, Wimax, etc. The various communication paths may provide a direct connection between the meters and the server/workstation, and/or may provide connection through the Internet via an Internet Service Provider (ISP). System 100 in FIG. 1 illustrates an exemplary Internet connection 126 connecting meter 104 to server/workstation 127, and an exemplary cellular phone network connection 125, connecting sub-meter 105 to server workstation 127. These communication paths could also, for example, include a combination of these networks. For example, sub-meter 105 could alternatively use any suitable wireless protocol (including 802.11a/g/n, wireless internet protocol, 3G, 4G, GSM, PHS, HCSD, TACS, CDMA, HSDPA, TDMA, CDMA2000, iDEN, TD-SCDMA, EV-DO, Mobitex, UMTS, FDMA, NMT, WCDMA, GAN, PCS, WiDEN, GPRS, PDC, WiMAX, and/or ISM band) over a network such as cellular network 125 to connect the meters to each other and/or to a public or private network (e.g., Internet 126) and to any appropriate server/workstation 127. For example, the ISM band may allow for either battery operated and/or inductively powered meters which can operate without having to be plugged in and/or connected to a wired interface and/or power. In embodiments using an Internet protocol, meter 104 may utilize a dynamic IP address, and, once powered and connected to the Internet via an Ethernet connection, may automatically find server/workstation 127 on the network and register each new channel as a new user, assigning a unique address for each channel. For example, the device may each have an auto configure and registration mode which allows the installer to remotely activate and register the device to a particular building using a laptop with a wireless card and/or a handheld smart phone like device.

The server/workstation 127 and the various meters may collect the pulse data in a variety of ways. For example, server/workstation 127 may host a website which may accumulate the pulses in one or more memories such as data registers. There may be one or more memories per sensor. Depending on the type of meter device utilized and on the type of consumable product/energy source, the data pulses and/or other signal indication may be converted to consumption (e.g. kWhr, Therm, Gallons, Lumens, etc.) on each measured supply feed or distribution service based on a programmed conversion factor. The time rate of measuring and collecting pulse data may be pre-programmed or adjusted based on such factors as the type of analysis to be done on the data, the bandwidth available to transfer the data from the meters to the server/workstation, or the capability of the meters themselves. The pulse data may be accompanied by meta-data, such as time stamps of when the pulses were measured. The data may further be protected with data encryption and/or other security measures to ensure the integrity and privacy of the data during transmission between the meters and the server/workstation 127 and during access to the data once stored in server/workstation 127. For example, the data may be encrypted and/or accompanied by a digital signature to ensure that the meters may not be altered or spoofed. An initial key exchange may occur between the meters themselves and/or between the meters and/or the workstation. In this way, once the meters are registered, the communications may not be spoofed and/or altered. Hence all reporting is done in a secure manner. Where time stamps are used, the time stamps may utilize any time base/zone, such as GMT-0 such that collection of data may be time synchronized with other measurements collected from the same distribution system and/or facility, or from other distribution systems and/or facilities.

Figure 2:
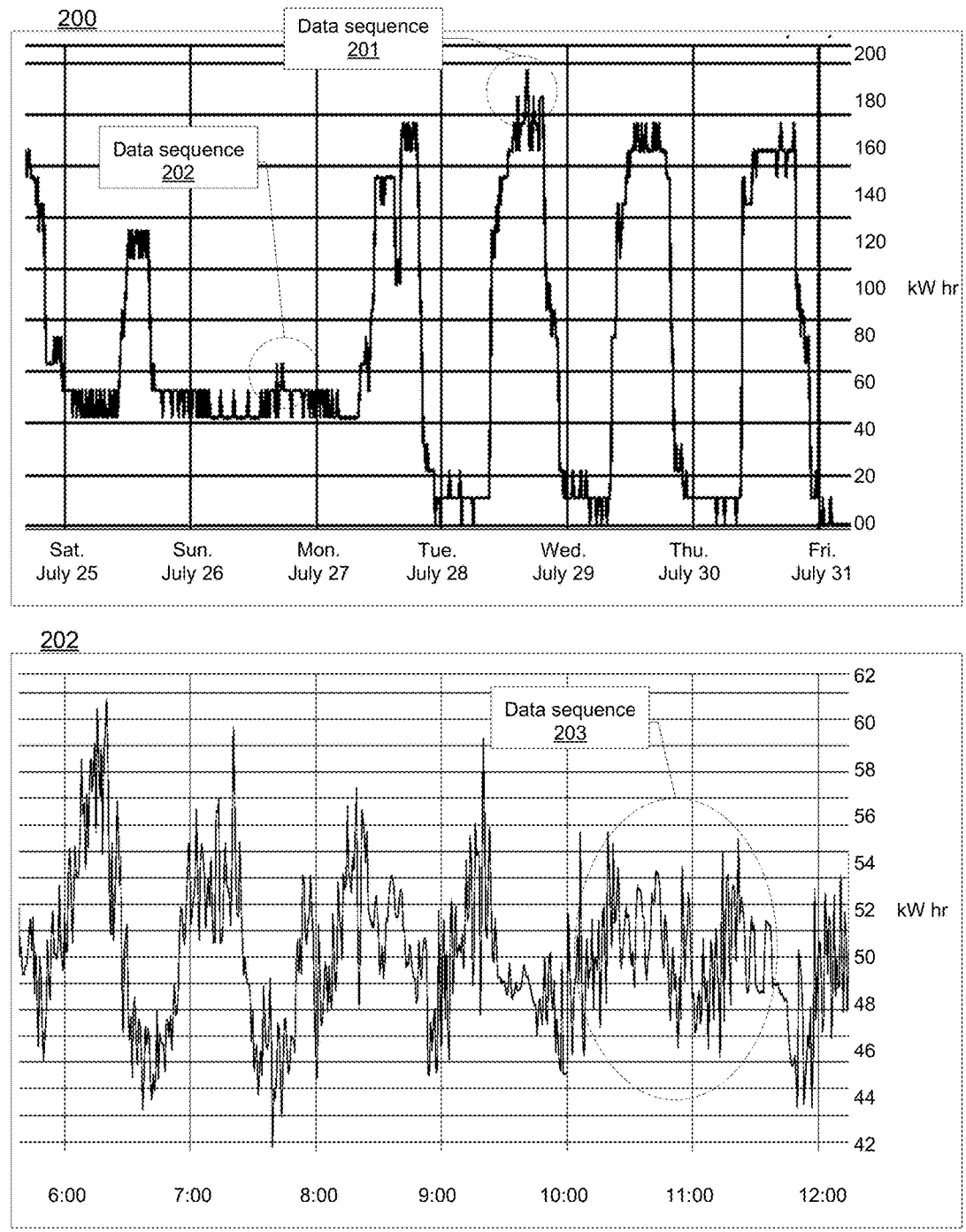
FIG. 2 illustrates an exemplary display graph illustrating data sequences representing consumption of a consumable product in a distribution system.

Once collected, the server/workstation may compile the data from each sensor/channel into time sequences of data. Exemplary data sequences may be graphically illustrated either on the meter and/or on the server/workstation 127 as, for example, illustrated in FIG. 2. This graph may also be analyzed remotely on a laptop computer, across the Internet, and/or on a smartphone. Graph 200, for example is a representative plot of kilowatt-hours (kWhr) of electrical power measured by meter 104 in FIG. 1 over a period of a week. As can be seen in FIG. 2, in exemplary embodiments, power typically oscillates during the week, with peaks reached during typical business hours and dropping during off hours and/or the weekend. Graph 200 may be variously configured including as a composite of smaller data sequences such as sequences 201 and 202. A representative graph of what data sequence 202 may look like is shown in more detail below the graph of data sequence 200. As can be seen in the graph of sequence 202, more detailed sequences, such as sequence 203 may be extracted. The detailed data sequences associated with individual meters may help pinpoint potential issues with the generation and/or use of a particular consumable resource.

Figure 3:
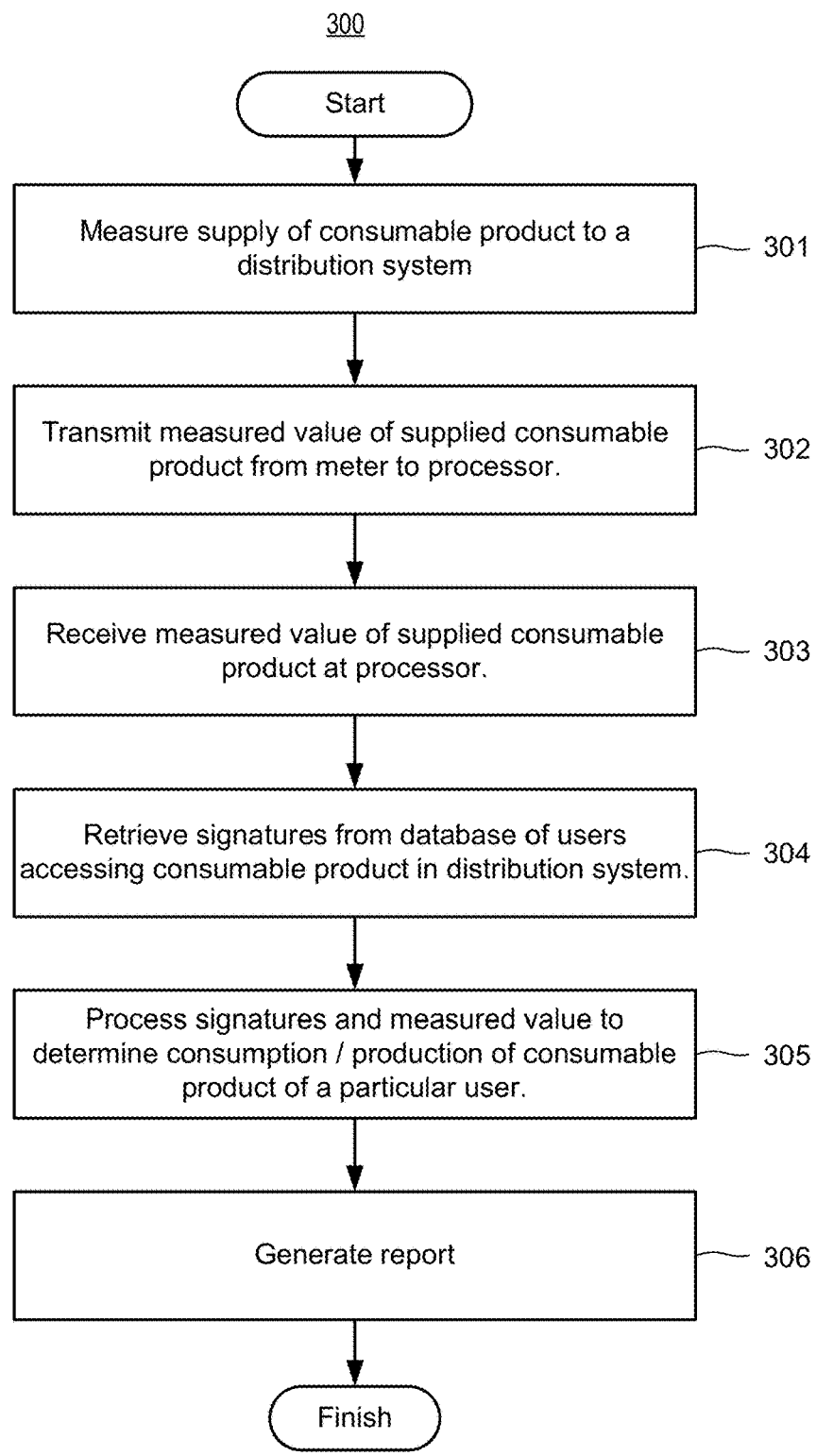
FIG. 3 illustrates a flow diagram of an embodiment for determining an amount of a consumable product accessed by a user.

FIG. 3 illustrates a process, according to some embodiments, to analyze these data sequences to determine any deviations from an expected amount of power that is consumed and/or produced by one or more particular users within a group of users connected to the measured service. Process 300 starts at 301 where the supply of a consumable product is measured in a distribution system by a meter (e.g. 104). The measured values are then transmitted from the meter in step 302, and subsequently received by a processor (e.g. server/workstation 127) in step 303. Steps 301, 302, and 303 may be accomplished as already described with respect to FIG. 1 and may result in one or more data sequences as illustrated in FIG. 2. Steps 301, 302, and 303 may occur on a pre-determined scheduled basis, as a result of the processor requesting the measured data from the meters, or both. In step 304, signatures of users are retrieved from a database. Each signature is a characterization of the access to the consumable product by one or more of the users. In step 305, the processor uses the signatures and the measured data sequences to determine which of the group of users connected to the distribution service is actually accessing the consumable product, and/or how much of the product is being accessed. Further, the consumable products consumption and/or generation from a plurality of facilities may be aggregated over time and/or over different facilities and used to formulate profile for a collection of assets. These profiles may then be used to negotiate with various suppliers of consumable products in the purchase of the consumable product. For example, an individual building owner often lacks sufficient market power to negotiate efficiently. However, using embodiments tens, hundreds, thousands, ten thousand, and even hundreds of thousands of facilities may be aggregated over the continent and over the world to negotiate the least expensive rates for consumption of the consumable products and the most favorable offsets for sources of the consumable products. In this manner, embodiments may allow the aggregation of many facilities to provide market power and to take advantage of the smart networks for consumables and the increasing deregulated environments for the delivery of consumables.

As an example of step 305, a processor in server/workstation 127 may use a pattern matching algorithm to match data sequence 203, illustrated in FIG. 2, to a signature which characterizes cell tower 116 in FIG. 1. The processor may further use more than one signature or may combine signatures to determine use of the resource by one or more users. For example, signatures for cell tower 116 and HVAC 119 may be combined additively to determine simultaneous use by 116 and 119. The processor may also manipulate the signatures and/or data sequence using various signal processing algorithms in the process of determining the users. For example, the processor may transform the signatures and data sequences from the time domain to the frequency domain using various Fourier transform algorithms. The processor may also use various artificial intelligence/smart agent/learning algorithms to process the signatures and data sequences either in the time domain and/or the frequency domain. The algorithm may also smooth the uses by filtering them with a high pass and/or low pass filter in order. In exemplary embodiments, the use of filters allows the artificial intelligence algorithms to operate more efficiently. For example, the processor may train a neural network on known operating conditions of various users, different combinations of signatures, and various data sequences acquired during the known operating conditions (with or without filtration) to develop a matching algorithm that is subsequently used in identifying later aberrations from known usage patterns.

In one exemplary embodiment, an artificial intelligence engine may implement the following algorithms:
  a. Average Exceeding Threshold by Standard Deviation
   1. Sample 30 minutes data;
   2. Determine if in occupied mode or unoccupied mode, determine outside temperature;
   3. Look at averages of sampled data to see if it exceeds the previous average (threshold power) by a standard deviation (either user selectable or automatically determined by past experience;
   4. In event the Threshold Power is exceeded, send email energy alarm to network administrator and/or customer including, for example, date, time and alarm type such as reading.
  b. Determine Appropriate Start and Stop Times
   1. Monitor data points immediately following occupancy in the Morning start up sequence including outdoor temperature;

2. As slope of kW line changes by an administrator configurable amount in consecutive data points (including average time windows), store the amount of change;
3. The result may be used to alert the building owner based on the forecast of what time their building should start and compare that to what time they have in their occupancy schedule.
4. Allows critical functions such as HVAC to be matched to actual work schedules in building.

The Artificial Intelligence Engine may constantly search the utility signatures in the database to associate a signature to a hard asset. For example: a 50 HP Fan Motor with Variable Frequency Drive may have a particular electrical consumption signature comprised of amps, power factor, watts. The AI engine may constantly review every library signature in the database (whether real or from a factory test stand—manufacturer's data) to correlate the motor signature to the library via statistical analysis. The AI engine may determine a correlation error factor between the motor signature and the library signatures (e.g. motor signature–library signature=error factor) via heuristics, optimization, simulated annealing, beam search, random optimization and/or a custom AI algorithm. When the error factor is below an acceptable level, the AI engine may output the load associated with the library signature, i.e. the 50 KW fan motor with Variable Frequency Drive.

The AI engine may thus inform an operator what load to look for. The AI engine may also write to the facility automation system sending computer code (bacnet, lontalk, any communication protocol accepted by facility automation system) to shutdown the load (50 Hp motor in this case) based on a permissive such as occupancy of facility, demand reduction, etc. In simple terms, an exemplary embodiment captures a signature measured from the distribution system and compares the measured signature to the library of signatures. The AI engine may search for Global Signatures such as for an entire facility or a sub-level within the facility (e.g. 50 KW Motor in a HVAC Unit on Roof). The comparison may be used to isolate and identify potential loads. The potential loads may then be communicated to an operator/customer or automatically controlled (e.g. on/off) via a communication protocol to regulate use of the distributed service.

Returning now to FIG. 3, the sequence will be further explained. After step 306, the processor (e.g. server/workstation 127) may then generate reports which detail the usage of the consumable product by various users and/or alerts when any user diverges from an expected usage. The report may be customized to detail access by a particular user over a fixed duration, and/or may detail a group of users of a specific tenant. The processor may further determine costs of the access by the particular user and/or group of users to the consumable product and include the cost in the report. For example, as in FIG. 1, the consumable product may be a public utility such as electrical power. Cost may simply be based on a constant rate, or may be based on a tiered utility rate which accounts for different rates at different times (i.e. peak and non-peak usage times). The reports may also include usage of a consumable product in graphical form, such as in FIG. 2. The report may further include other secondary data that may be derived from the consumable product usage. Exemplary secondary data may include calculations of green house gas emissions by a particular user. These reports may be processed as bills and sent directly to the users as well as copied to the building managers.

Process 300 may be performed by an autonomous processor that works continuously collecting data (e.g., pulse data) and determining users and/or aberrations in real-time or near real-time, and generating reports on a fixed schedule (i.e. monthly) or based on a certain level of use or cost (or aberrations in use or cost) being reached by a particular user or group of users. The reports may take the form of an invoice and sent to tenants responsible for the particular users detailed in the report. These reports may be generated and sent in the form of hard-copies and mailed, in electronic form and sent via electronic mail, text message or other form of electronic transfer, or in the form of voice messages sent via phone line. Further embodiments may allow the reports, including billing information and graphical data to be displayed on any customer interface device; desktop, laptop, PDA, Blackberry and or client internet portal, and may be further provided through a website hosted by the processor. By serving the data from a website, a tenant/customer may be able to view usage and cost data and graphic displays in real-time and/or near real-time. As referred herein, "real-time" refers to updating the usage data as it is collected and calculated with little and/or relatively little delay other than the time it takes to process the data. The amount of delay may be a designed limit on processing time, such that the data may be used in closed loop control of users, or the delay may simply be dependent on the resources available in measuring, transferring, and processing the data. For the purposes of this application, "real-time" and "near real-time" refers to the same concept in processing data.

Figure 4:
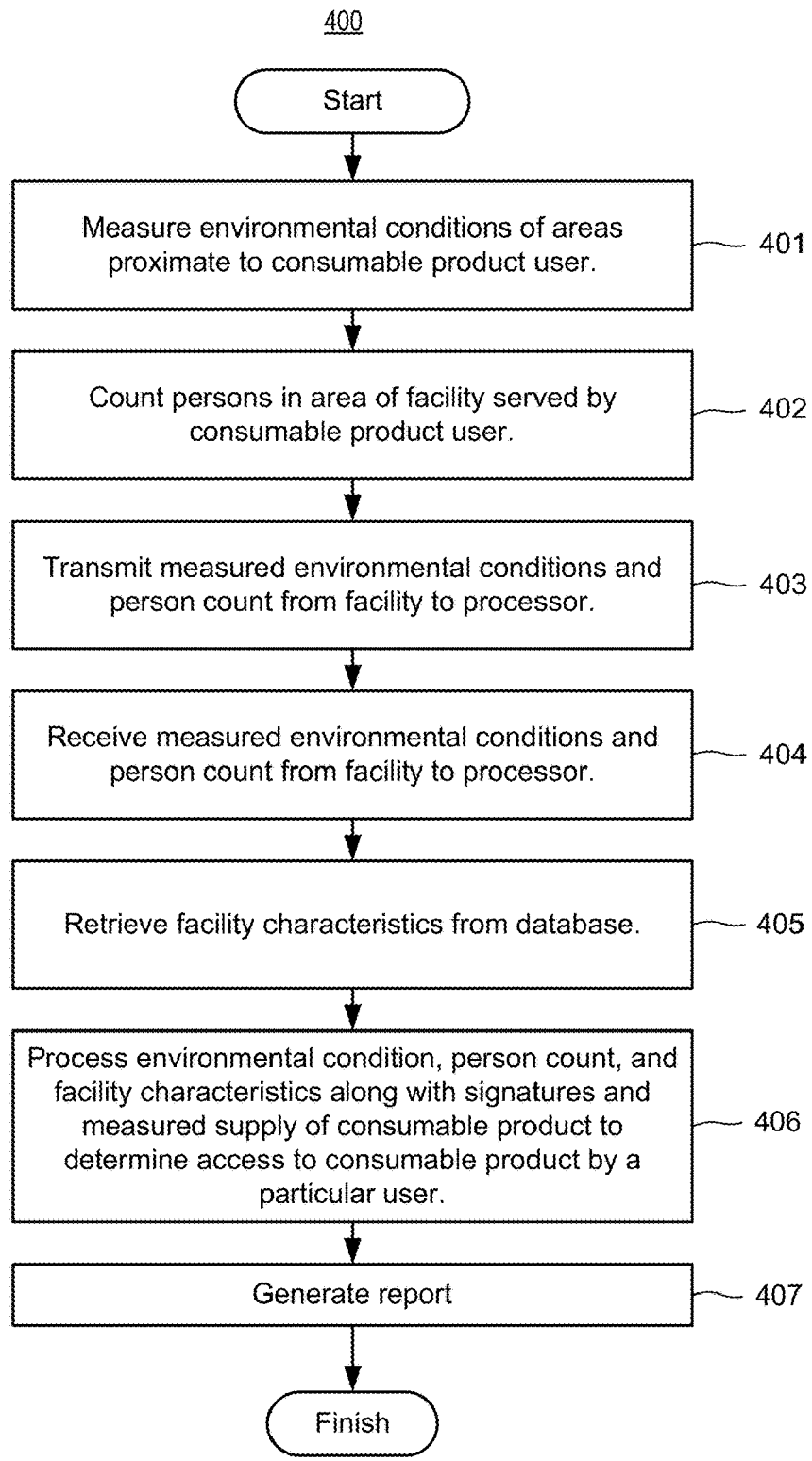
FIG. 4 illustrates a flow diagram of another embodiment for determining an amount of a consumable product accessed by a user.
Figure 5:
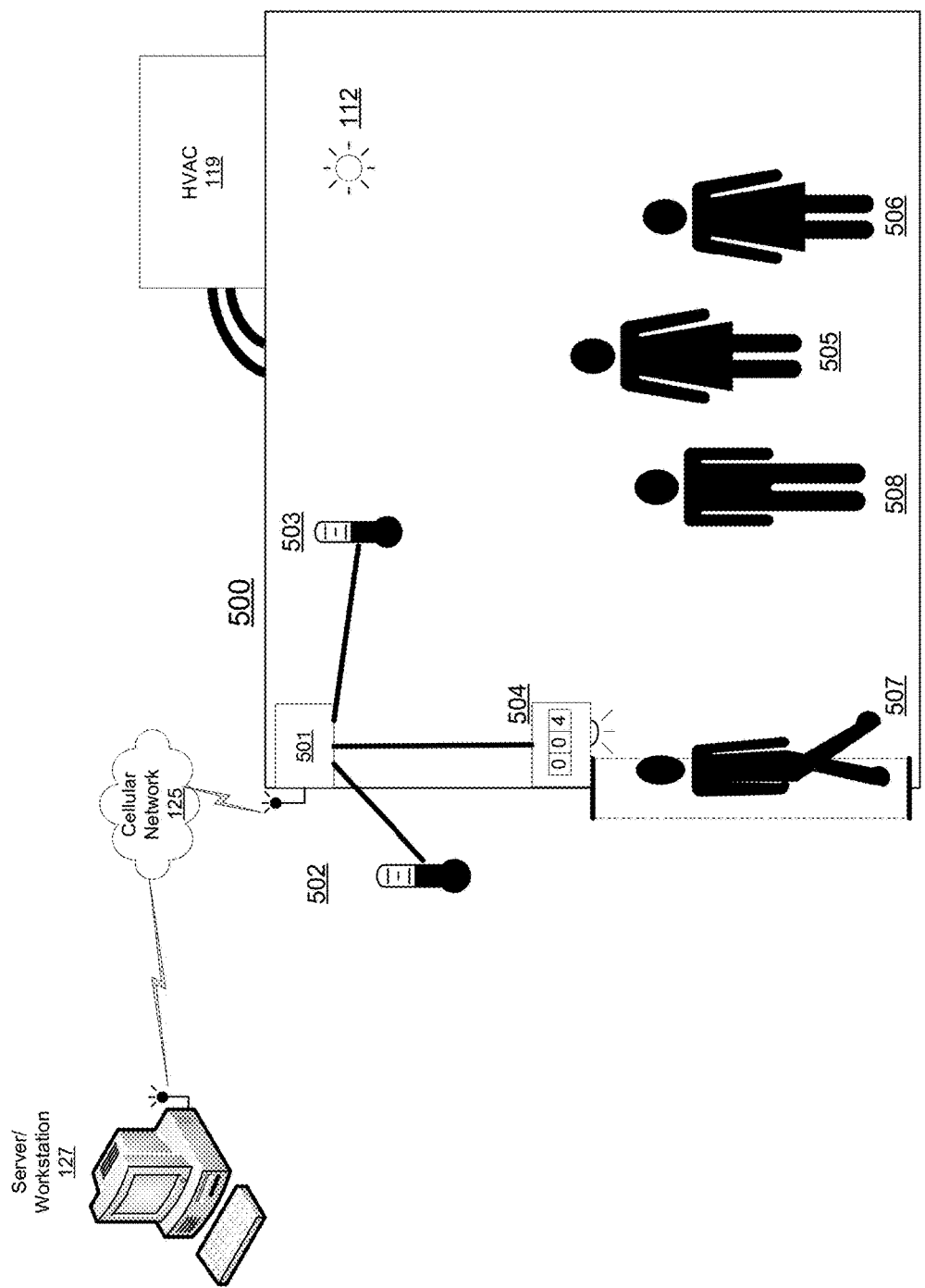
FIG. 5 illustrates an exemplary facility incorporating various sensors which may be used with various embodiments.

Process 300 may be augmented with additional steps of process 400 illustrated in FIG. 4, and described with respect to FIG. 5, for incorporating operating conditions into the determination of the various users. In this exemplary embodiment, Process 400 starts at 401 by measuring environmental conditions of areas which are proximate to a particular user or are served by a particular user. For example, as illustrated in FIG. 5, HVAC 119 and lighting 120 may serve a room 500 in the facility 101 of FIG. 1. Environmental conditions such as temperature 503 inside of the room and temperature 502 outside of the room may be measured. Other operating conditions which affect usage of the consumable product may also be captured, as in step 402 for example, where persons within room 500 may be counted by a sensor 504. Such measurements of operating conditions may be accompanied by meta-data such as time stamps or time intervals such that the operating conditions may later be correlated to usage data of electrical power by users 119 and 120. In step 403, the measured environmental and other captured operating conditions are transmitted to the processor. FIG. 5 illustrates an exemplary data collection node 501 collecting the measured values and transmitting them to the processor in server/workstation 127 through cellular network 125. Data collection node 501, may be the same as meters 104 and 105, or may be some other computing platform operating in the same manner as 104 and 105 over the same types of communication links to transfer data to server/workstation 127. In step 404, the processor in server/workstation 127 receives the transmitted data. In addition to receiving operating conditions measured from the facility, the processor may retrieve other operating conditions from a database such as in step 405. The processor, in step 405, may retrieve facility characteristics from the database, such as square footage of rooms in the facility; age of the facility; insulation factors of walls, windows, and other structures; load factors which indicate peak usage versus minimal usage ratios, historical seasonal usage information, age and efficiencies of the users, etc. In step 406, the same steps as in steps 301 to 305 of process 300 are performed except that the operating conditions measured from the facility and retrieved from the database are incorporated in to the step 305 for determining access to the consumable product by a particular user. In step 407, a report may be generated in the same manner as in step 306 of process 300. The report may further include details of the operating conditions acquired in steps 401 to 405, and other secondary data that may be derived from the operating conditions and consumable product usage. Exemplary secondary data may include calculations of green house gas emissions by a particular user.

As with process 300, the steps of process 400 may be performed autonomously, in which the operating conditions and usage data are continuously collected, users are determined in real-time or near real-time, and reports are generated on a fixed schedule (i.e. monthly) or when certain levels of usage or costs are reached by a particular user or group of users.

Figure 6:
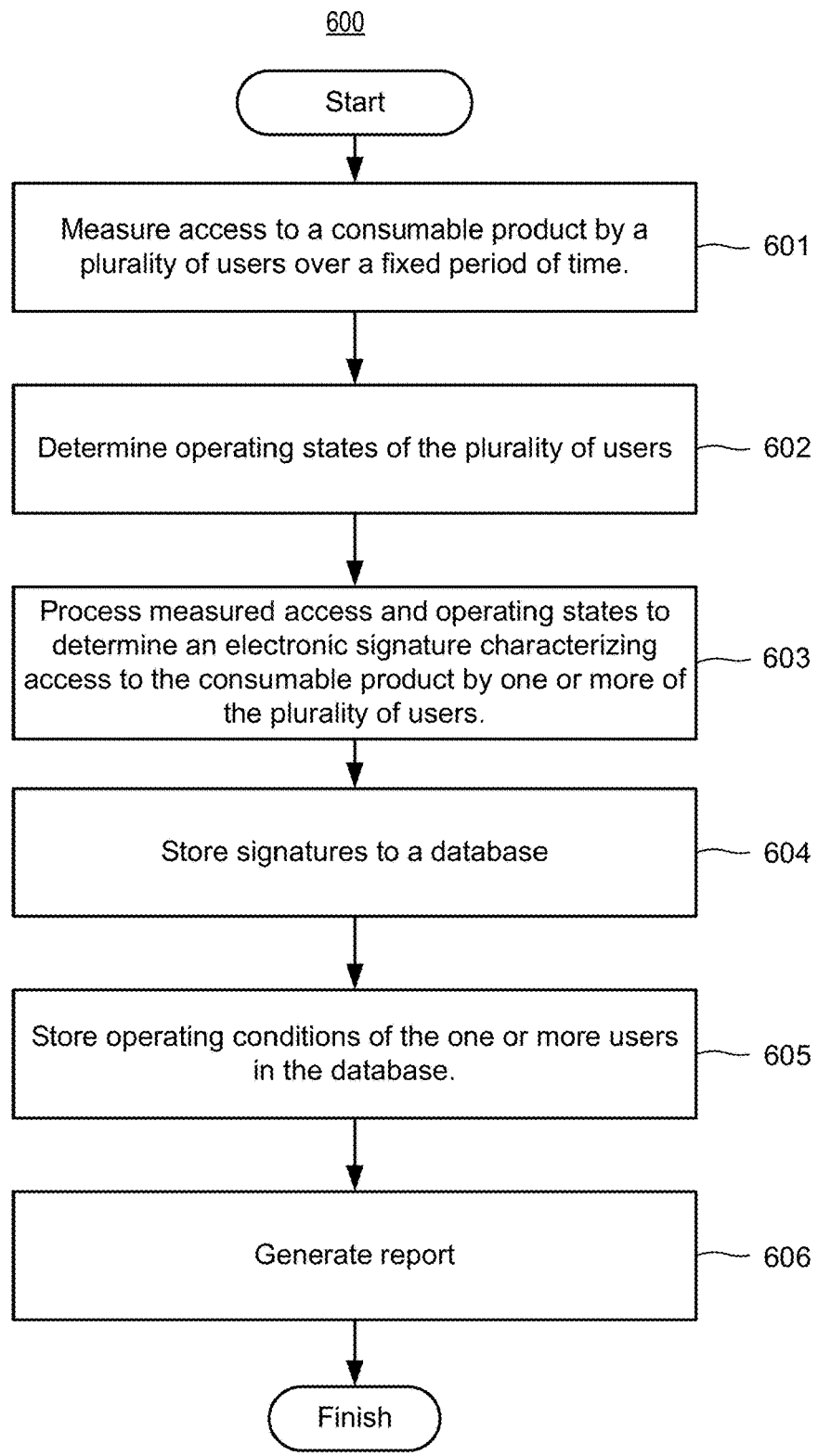
FIG. 6 illustrates a flow diagram of an embodiment for determining signatures which characterize access to a consumable product by one or more users.

In order to perform processes 300 and 400, the processor performing the process it may be desirable for the processor to have either preloaded and/or learned signatures of the various users connected to the distribution system. In another exemplary embodiment, the processor may create these signatures according to a process 600 as illustrated in FIG. 6. In one exemplary embodiment, Process 600 in FIG. 6 starts by measuring access to a consumable product by a plurality of users on a supply feed or a distribution service over a fixed period of time. During the measuring, the operating states of the plurality of users are also determined. The operating states may be determined by monitoring the users or controlling the users. The monitoring and controlling may be performed by the processor using the same or similar communication links used for receiving data from meters. Other operating conditions may also be monitored or measured over the fixed period of time. The operating conditions may include the same measured (e.g. inside and outside temperature, person count, etc.) and facility characteristics (e.g. square footage, facility age, insulation factors, load factors, historical seasonal usage information, age and efficiencies of the users, etc.) as in process 400. Measuring access to the consumable product and monitoring the operating conditions may be achieved by the same or similar manner as is accomplished in processes 300 and 400. Once access to the consumable product and operating conditions are measured or determined, the data is correlated to the known operating states to determine the signatures which characterize the access by one or more users of the plurality of users. The signatures may contain variables to account for different operating conditions or may assume an average or estimated operating condition. Multiple signatures may further be created for the same on or more users, with each signature reflecting a different set of operating conditions.

The creation of signatures may be accomplished by a variety of different algorithms. For example, referring back to FIG. 2, data sequence 203 may have been recorded when HVAC 119 was being cycled on and off, lighting 112 was being powered during regular operating hours of the facility, and cell tower 116 was operating. A processor in server/workstation 127 may use a pattern matching algorithm to correlate transitions in data sequence 203 to the changes in states of HVAC 119, lighting 112, and cell tower 116 to create signatures which characterize each of these loads or a combination of these loads. Previously determined signatures (e.g. for lighting 112 and HVAC 119), may be used to cancel out the effects of certain loads (e.g. lighting and HVAC) in determining a signature of just one of the users (e.g. cell tower). In this manner, the signature may be combinable or divisible to uniquely reflect use of the consumable product by a combination of users on a single supply feed or distribution service. The processor may also manipulate the data sequence and state information using various signal processing algorithms in the process of determining the signatures. For example, the processor may transform the data sequences from the time domain to the frequency domain using various Fourier transform algorithms. The processor may also use various artificial intelligence/intelligent agents/learning algorithms to determine the signatures. For example, the processor may train a neural network on known operating conditions, operating states, and measured data sequences to determine the sequences. The signatures may take on a plurality of forms, including a time sequence of data or a frequency spectrum of data that may be combined with other signatures to be matched to measured data sequences. In the case of using a neural network to identify a user in process 300 and 400, the signature may be in the form of branch weights in the neural network for identifying a particular combination of users.

After determining one or more signatures, the signatures may be stored in a database at step 604. In addition to storing the signatures, the measured or determined operating conditions may also be stored to the database in step 605. The signatures and operating conditions may be stored in a single database, or may be stored in separate and numerous databases. The databases may be collocated with the processor, or may be remote and accessed by the processor through a network connection. Process 600 may finish with generating a report of the stored signatures and operating conditions. The databases may then be used, for example, in processes 300 and 400 for later determining access to the consumable product by a particular user. In the example of FIG. 1, the various signatures would reflect various electrical loads and sources as already described. The database of signatures may also be used in other processes such as determining energy ratings of users or compliance of different users and facilities with applicable governmental regulations, or trade group certifications.

Figure 8:
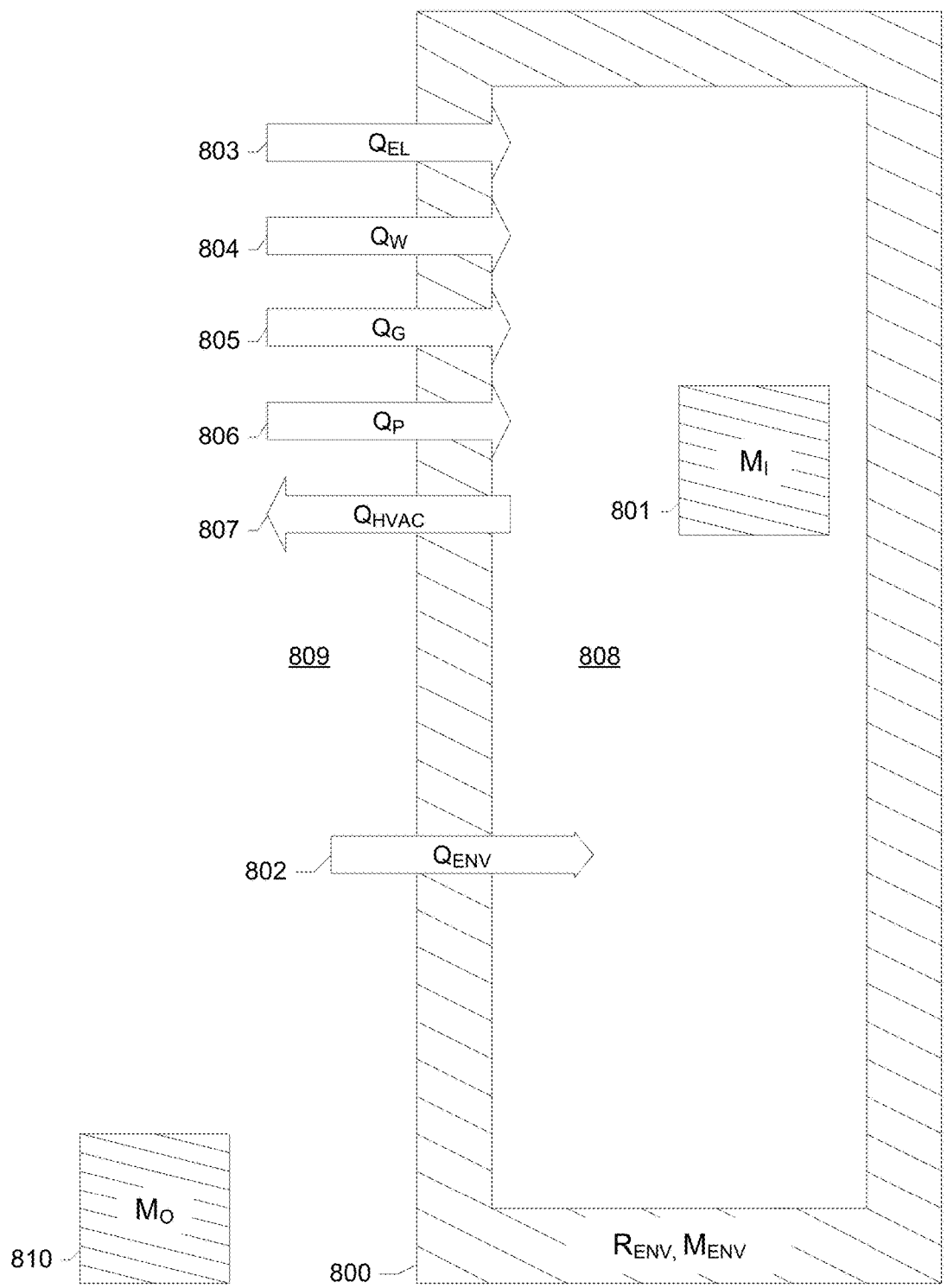
FIG. 8 illustrates a building envelope in which various embodiments may be implemented.

In addition to determining energy usage by users within a facility, determining energy performance of the facility may also be used in various embodiments. FIG. 8 illustrates a building envelope 800 of a facility in which energy performance may be determined. Building envelope 800 may include the building structure, which thermally separates an enclosed volume from an outside environment. The structure may include, for example, any combination of building material (e.g., cement, glass, wood, metal, etc.), and may be used for any purpose (e.g., residential, commercial, industrial, etc.). For simplicity, building envelope may be shown schematically to include a solid perimeter with a single enclosed space, but the building envelope may also include floors, ceilings, and any other structure which encloses the volume of interior space.

Various aspects of building envelope 800 described herein may also apply equally to multi-room structures, a single room within a multi-room structure, a single floor within a multi-floor structure, structures with openings such as doorways, vents, windows and other fenestration, structures with ceilings of various heights, structures with various shaped perimeters, and/or structures with walls, floors, and ceilings of different shapes and sizes.

One function of building envelope 800 is to provide thermal isolation between an outside environment 809 and inside environment 808, such that the inside environment 808 may be controlled in an energy efficient manner.

Although, generally, the outside environment 809 comprises the space outside of the entire building structure, outside environment 809 may equally refer to one or more rooms or spaces within the building structure bordering a building envelope which encloses only portion of the building structure and/or to adjacent buildings where, for example, the building abuts an adjacent building. The building envelope may, for example, enclose a group of one or more rooms, or a single floor.

Determining energy efficiency of a building may include determining the thermal properties of the building envelope. In particular, where a building envelope has a thermal mass, the building may have several components of induced and residual heat flow through the building envelope.

Thermal mass (e.g., heat capacity) may be considered to be the property of an object to store heat and may be measured in Joules per degree Celsius (J/° C.), in British Thermal Units per degree Fahrenheit (BTU/° F.), and/or equivalent. The thermal mass of an object may depend on the specific heat capacities of the materials making up the object. Specific heat capacity, denoted C, is often considered the materials heat capacity per unit of the material, and may be specified per mass (e.g., BTU/[° F.×$lb_m$]), and/or per volume (e.g., BTU/[° F.×$ft^3$]). Dense objects, such as brick and stone, typically have a greater capacity to store heat than less dense objects, such as wood or foam insulation. The building envelope's thermal mass, $M_{ENV}$, will be a function of the material making up the buildings structure.

In addition to the $M_{ENV}$ of the building envelope, thermal mass may also be present within the inside environment, represented as object 801 having thermal mass $M_I$, and within the outside environment, represented by object 810 having a thermal mass $M_O$. Objects 801 and 810 may each represent a single object, or may each represent a composite of the thermal masses of multiple objects. Inside object 801, for example, may include furniture, equipment, vehicles, people, warehoused goods, and other movable or permanently affixed structures. Outside object 810 may include other buildings, building structures, roadways, and other movable and affixed objects.

Various embodiments include determining heat flow through and/or into the building envelope. FIG. 8 includes various illustrative examples of heat flow shown as heat paths 802 to 807 having respective heat flows $Q_{ENV}$, $Q_{EL}$, $Q_W$, $Q_G$, $Q_P$, and $Q_{HVAC}$. Heat flow is often the quantity of heat energy transferred per unit of time (e.g., W=J/s, BTU/Hr). Related to heat flow, heat flux, denoted $Q^f$, may be defined as the quantity of heat per cross-sectional unit area, and may be measured in watts per meter squared (W/m²), and/or other equivalent units. The heat paths shown in FIG. 8 may move heat between the outside environment 809 and the inside environment 808 and between the environments and the thermal masses $M_{EV}$, $M_I$ and $M_O$. Various embodiments include tracking of heat flow along the various induced paths periodically over time.

Heat path 803-807 often represent induced heat flow, and heat path 802 often represents a residual heat flow. Induced heat flow may be the result of supplying or injecting energy sources into the building envelope, which may then produce heat through the sources consumption (i.e., a consumable product). Examples of energy sources include electricity, fossil fuels, and people. Induced heat flow may also result by mechanical means, such as heating, ventilation, and air conditioning (HVAC) systems, which often mechanically move heat in or out the building envelope to control the climate within the building envelope.

Heat path 803, $Q_{EL}$, of FIG. 8, represents heat flow produced by electrical power supplied to the building envelope. In various aspects, electrical power may be measured and/or its distribution monitored as described with respect to FIG. 1 in order to determine heat produced from its use within the building envelope.

Referring back to FIG. 1, heat flow 803, $Q_{EL}$, into the building envelope may depend on the distribution and use of the electrical power. The distribution system itself, consisting of distribution point 106, and services 120-124, has electrical resistance and may have a power loss in the form of heat according to the equation of $P=I^2*R$, where P is the power consumed, I is the current passing through any particular path, and R is the resistance of the path. Heat may also be produced in various forms by the end load. For example, lighting 107-112, may produce heat that is predominantly radiation heat, while computer equipment in computer server room 114 may heat the interior environment predominantly through conduction and convection. Other loads, such as charging circuit 129 may not convert all of the electrical power into heat, but may instead store the power in batteries, fuel cells, or other storage device. Still, other loads may convert some of the electrical power into mechanical work.

In various aspects, heat flow 803, $Q_{EL}$, is determined by measuring the flow of electrical power through one or more meters and sub-meters, such as 102-105, and/or by monitoring one or more loads, such as light/load meter 133 monitoring lighting 110. It should be noted that the various loads and distribution paths, such as HVACs 117-118, cell tower 116 and portions of services 120-122, may be outside of the building envelope, and thus, would not add heat within the building envelope environment.

Heat path 804, $Q_W$, in FIG. 8 may be another source of induced heat flow produced by the flow of water through the building envelope Like all matter, water has the ability to store heat, and has a heat capacity of 1 BTU/[° F.×$lb_m$] (approximately 4.2 J/(g*K)). As water flows through a building envelope, the water may transfer heat to or from the inside environment and/or the thermal mass of the building envelope. In many situations, the amount of heat transfer from water may be negligible, but in various embodiments, water has a non-insignificant effect. For example, in hotter climates, water which has been cooled through supply lines underground, may draw heat from the inside environment 808 as the water passes through pipes or through radiators within the building. In other embodiments, hot water used to heat numerous buildings in a campus system may be piped into a building envelope and through radiators to dissipate the stored heat within the building envelope. In yet other embodiments, water which has been heated within the building envelope by heat produced from another energy source may carry heat from the building envelope through drain pipes. In various embodiments, water flow and temperature may be monitored in and/or out of the building in order to calculate a heat flow 804, $Q_W$, resulting from the water flow.

Heat path 805, $Q_G$, in FIG. 8 provides another source of induced heat flow produced by the flow of fossil, bio, or synthetic fuels. The fuel may be a gas, such as natural gas, biogas, propane, butane, etc., may be liquid, such as compressed natural gas, liquid propane, gasoline, kerosene, diesel, etc., or may be solid, for example coal, wood, etc. Like water, heat flow may result from the heat capacity of the fuel itself storing energy, transferring heat in or out of the building envelope directly as a result of the fuel flow. Accordingly, in various embodiments, temperature and fuel flow in and/or out of the building are monitored by one or more meters to calculate a heat flow $Q_G$ resulting from the heat capacity of the fuel.

Like electricity, the heat path 805, $Q_G$, may also result from fuel flowing into the building environment, and then being consumed to produce heat. For example, a building may have a natural gas utility supply used for water heating, furnaces, clothes dryers, cooking, and other various functions. The heat flow $Q_G$ resulting from consuming the fuel will depend on the quantity of fuel consumed and energy conversion efficiency of each particular application within the building envelope. Accordingly, one embodiment monitors distribution of the fuel to various consumption points within the building envelope, and determines heat flow based on known, estimated, or measured energy conversion/efficiency factors. For example, natural gas has a known energy conversion factor through combustion (e.g., 1000 BTU/ft$^3$). In a cooking application using natural gas, one embodiment may monitor the quantity of gas consumed by a stove and use the known energy conversion factor to determine heat transfer into the building envelope. In the same system, exhaust vents over the stove may be monitored to determine air temperature and flow from the cooking area to determine heat flow leaving the building envelope through the exhaust. In various embodiments, the heat path induced by the exhaust may be included in the heat flow calculation $Q_G$, or may be calculated as a separate heat flow factor. The heat flow resulting from the exhaust would be determined in the same way as water based on flow rate, temperature, and heat capacity of the exhaust.

Heat path 806 having heat flow $Q_P$ includes another source of induced heat flow resulting from the moving of self contained heat emitting bodies being moved in and out of the building. The most typical self contained heat emitting bodies are people moving in and/or out of the building. In various embodiments, doorways and other entrances to a building envelope are monitored to count people entering or exiting. The monitoring may exist only for building entrances, or may occur per floor, or per room. Each person's contribution to heat flow $Q_P$ may then be determined by estimating heat emission based on an average person. In another embodiment, heat emission estimates of each person may be based on more detailed monitoring which determines size, height and/or weight of persons entering and exiting the building, room, or floor. In yet another embodiment, each person's heat emission may be estimated based on the amount of activity each person exerts, which may be measured, for example, by using motion sensors. In yet another embodiment, thermal detectors or cameras may measure a person's heat signature or heat output to determine that person's contribution to $Q_P$.

Although $Q_P$ is described with respect to people, the same embodiments may equally be applied to other illustrative self contained heat emitting bodies such other animals. In yet another embodiment, the self contained heat emitting bodies may include automobiles moving in and out of parking garages or other spaces within the building envelope. In monitoring the automobiles, various embodiments may treat the automobile, drivers, and passengers as one heat emitting body, or may distinguish each automobile, driver, and passenger as separate heat emitting bodies and/or based on the size and type of the automobile.

Heat path 807 having a heat flow $Q_{HVAC}$ represents heat flow induced by Heating, Ventilation, and Air Conditioning (HVAC) systems. HVAC systems, such as a heat pump, typically mechanically move heat in or out of the building envelope to control the climate inside the building envelope.

In various embodiments, an HVAC system may include electric heaters, natural gas furnaces, hot/chilled water circulation, or other systems, which create heat paths that include previously described heat paths, such as $Q_{EL}$, $Q_W$, or $Q_G$. For example, an HVAC system with electric heaters would generate heat directly from an electric utility service as described above with respect to $Q_{EL}$. In these embodiments, the heat path may be considered as either $Q_{HVAC}$ or as one of the other described heat flows. In other various embodiments having an HVAC system such as an air conditioning system or a heat pump, electricity or other energy source may be converted into mechanical energy to create a separate heat path which forces heat in or out of a building envelope.

In various embodiments, heat flow $Q_{HVAC}$ may be determined by directly monitoring input and/or outputs of the HVAC system. For example, in a forced air furnace, intake and outtake airflow, along with temperature of the intake and outtake air may be measured with one or more meters to calculate the heat output of the furnace. In other embodiments, the energy source (e.g., electricity) supplying the HVAC system may be monitored, and an estimated, measured, or manufacture supplied conversion/efficiency factor may be applied to determine the heat movement through the building envelope based on the measured energy source.

As shown in FIG. 8, in addition to the induced heat paths heat paths 803 to 807 having respective heat flows $Q_{EL}$, $Q_W$, $Q_G$, $Q_P$, and $Q_{HVAC}$, a building envelope may also have a residual net heat path 802 having a heat flow $Q_{ENV}$. Heat flow $Q_{ENV}$, often depends on the insulation properties of the building structure.

In a simple embodiment, heat path 802 may be predominantly through conduction of the building envelope and can be characterized by a composite thermal resistance, or $R_{VALUE}$, of the material that makes up the building structure. $R_{VALUE}$ for a particular material is described by the equation $R_{VALUE}=(T2-T1)/Q^f$, where T2–T1 is the delta temperature on either side of the material and $Q^f$ is the heat flux, or heat flow per unit area, through the material. $R_{VALUE}$ for many materials is well known and provided by the manufacturer.

Figure 14:
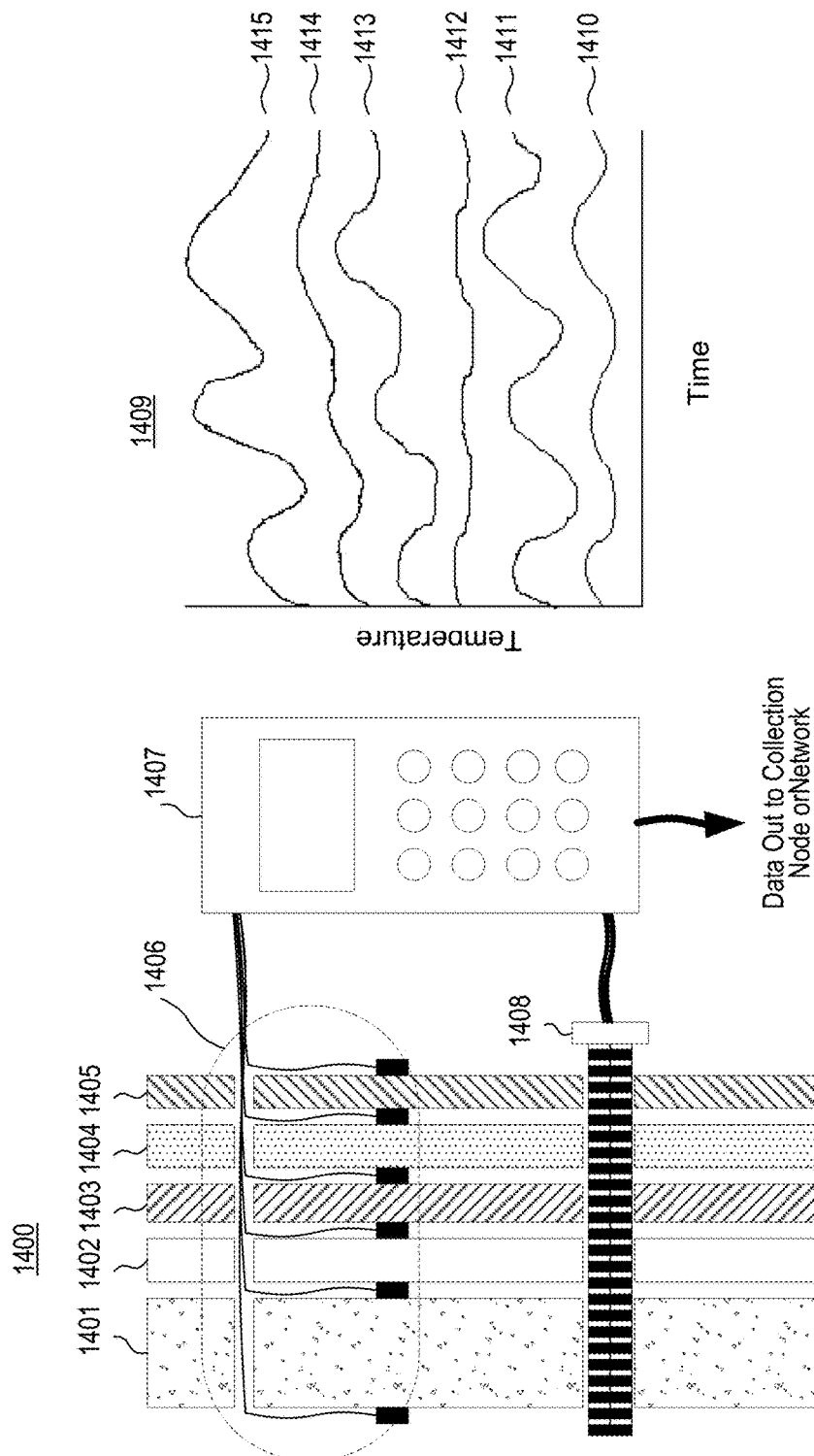
FIG. 14 illustrates various embodiments of sensors and resulting sensor data.

Often, the building structure may not be a single material, but a composite of multiple materials in layers. For example, as shown in FIG. 14, a cross-sectional view of a building wall 1400 may include an outside concrete layer 1401, next to a thin air layer 1402, followed by a sheathing layer 1403, an insulation layer 1404, and a drywall layer 1405. In this example a composite $R_{VALUE}$ would be calculated as $R_{VALUE}=R_{VALUE(CONCRETE)}+R_{VALUE(AIR)}+R_{VALUE(SHEATHING)}+R_{VALUE(INSULATION)}+R_{VALUE(DRYWALL)}$. In practice, wall construction is typically more complicated and may include many more parts such as wooden or metal studs, epoxies, nails, pipes, etc. To determine $R_{VALUE}$ of complicated wall assemblies, a weighted average of each $R_{VALUE}$ of each material may be used, or the composite $R_{VALUE}$ may be computed using modeling software of the wall assembly.

Figure 9:
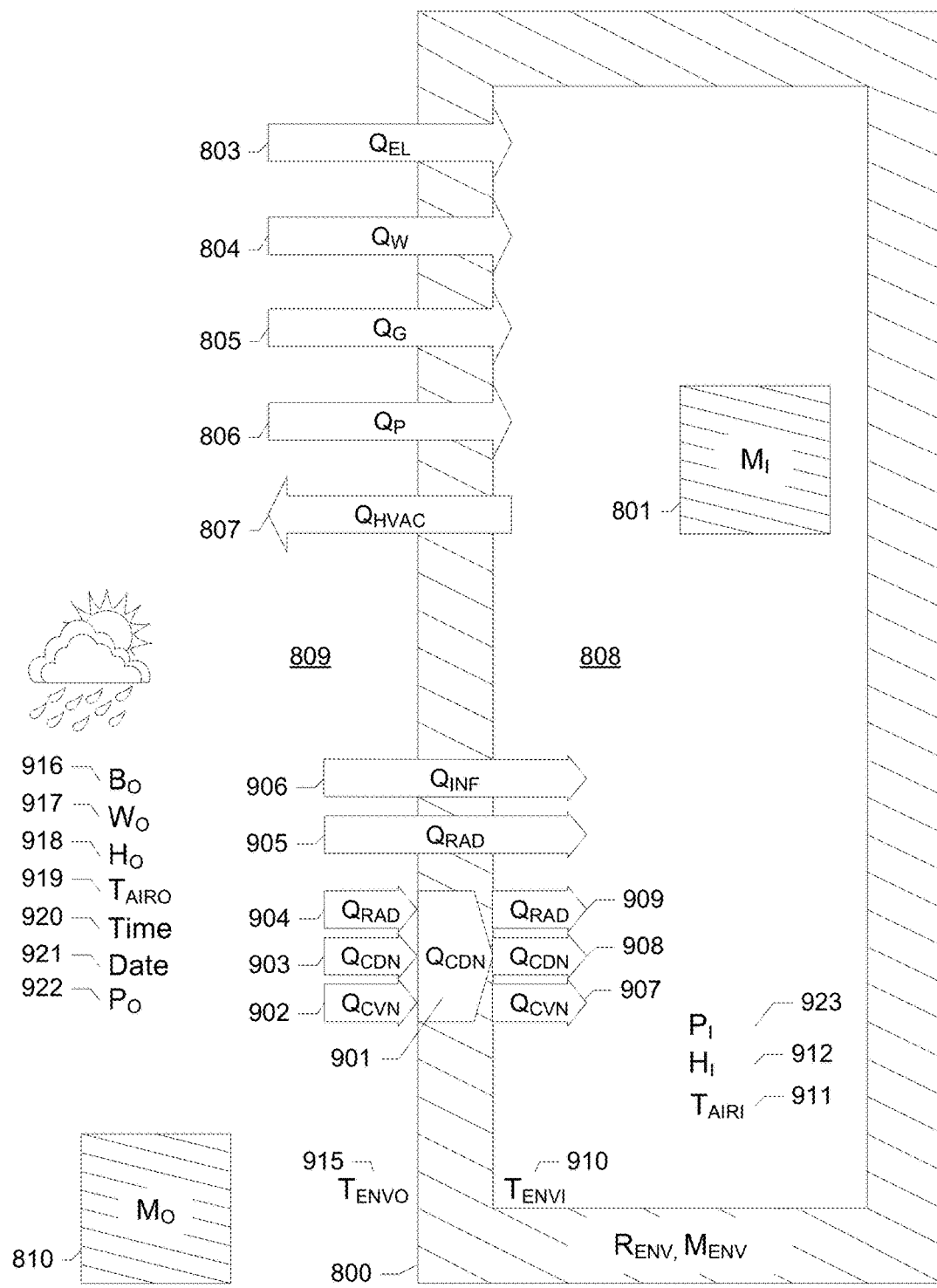
FIG. 9 illustrates heat flow through a building envelope in which various embodiments may be implemented.

In many buildings, $R_{VALUE}$, based on conduction alone is insufficient since many more factors contribute to the residual thermal path 802. Radiation and convection from the atmosphere also play a role, as well as air infiltration through doorways, windows, vents, and cracks. FIG. 9 illustrates the building envelope of FIG. 8, but replaces thermal path 802 with a more comprehensive illustration of residual thermal paths 901 to 909. In FIG. 9, thermal path 901 having heat flow $Q_{CDN}$ represents the conduction thermal path previously discussed. Heat flow $Q_{CDN}$ will depend on $R_{ENV}$, the $R_{VALUE}$ of the building envelope, and on the temperatures $T_{ENVI}$ and $T_{ENVO}$, which often are the inside and outside surface temperatures 910 and 915 respectively of the building envelope. $T_{ENVI}$ and $T_{ENVO}$, in turn, may be determined by heat transfer from the inside and outside environments 808 and 809, through radiation, conduction and convection.

In the outside environment, radiation from the sun, represented by $Q_{RAD}$ may be determined predominantly by the sun position, obstructions which block the sun, atmospheric conditions such as cloudiness and green house effects, and reflectivity of the building surface. Time 920 and Date 921 may be used to determine sun position. Weather forecasts and models may be used, or direct measurements may be made at various locations on the outside of the building envelope, to determine atmospheric conditions such as brightness 916. From these factors, radiation hitting the building envelope may be determined. The determined radiation along with the known reflectivity of the surface may then be used to determine heat energy transferred to the outside surface and/or the lower temperature space or zone.

In addition to outside radiation, heating of the building envelope's outside surface occurs through conduction 903 and convection 902 having heat flow $Q_{CDN}$ and $Q_{CVN}$, respectively. Heat transfer through conduction can be determined by the difference between the air temperature 919 and building surface temperature 915 having temperatures $T_{AIRO}$ and $T_{ENVO}$ respectively, and the respective thermal masses (i.e., heat capacities) of the air and building envelope. The thermal mass of the air may vary with humidity 918 ($H_O$) and barometric pressure 922 ($P_O$). Heat transfer through convection 902 is affected by the same factors as conduction path 903, but may further be affected by atmospheric conditions such as wind 917 ($W_O$).

In the same ways that heat is transferred from the outside environment to the outside surface of the building envelope, heat may be transferred from the inside surface of the building envelope to the inside environment through radiation heat path 909, conduction heat path 908 and convection heat path 907.

Radiation may also enter the building envelope directly through heat path 905, $Q_{RAD}$, which may comprise openings such as doorways, windows, and/or other fenestration. Open doorways would provide no resistance to radiation entering, whereas windows will typically have a designed emissivity (e) which is a measure of the amount of radiation reflected, and thus prevented from entering the building envelope.

Building envelope may also have a residual heat path 906, $Q_{INF}$, resulting from air infiltration through openings in the building envelope. Heat path 906 has a representative thermal flow $Q_{INF}$, which may be determined by the cross section and positions of openings, and environmental factors such as outside wind $W_O$, inside and/or outside humidity, 918 ($H_O$) and 912 ($H_I$) respectively, and/or inside and/or outside barometric pressures, 922 ($P_O$) and 923 ($P_I$) respectively.

Building envelopes are generally designed to minimize the thermal paths 901-909 shown in FIG. 9. As previously discussed, as-built structures may not and often do not meet the insulation performance of a planned design after completion. Errors in the designed thermal performance may be caused by design variations that are not reflected in a model, construction of the structure which is not to specification, incorrect assumptions on building usage and weather, utility equipment which is not installed correctly or functioning according to specification, insufficient model fidelity, and numerous other factors. Further, a building's energy performance may change over time due to the aging of materials, modifications to building structures and systems, or damage to the structures.

In addition, thermal mass $M_{ENV}$ of the building envelope may impact the thermal performance of the building envelope by serving as a heat reservoir for some of the conducted heat through the building envelope, thereby damping or adding a time delay to the conducted heat transfer between the inside and outside environments. Likewise internal object 801 and external object 810 may have the same effect in dampening variations in the inside and outside temperatures 911 and 919 respectively. For example, a house in the countryside will be in the presence of a vastly different outside thermal mass than that of an office building within a heat island of a dense city, and thus the outside temperature of the building in the city may be higher. Further, objects 801 and 810 may be moved, or new objects erected, such as constructing new adjacent buildings. Because objects 801 and 810 may be moved or erected, their thermal impact on building envelope 800 may change over time.

Figure 10:
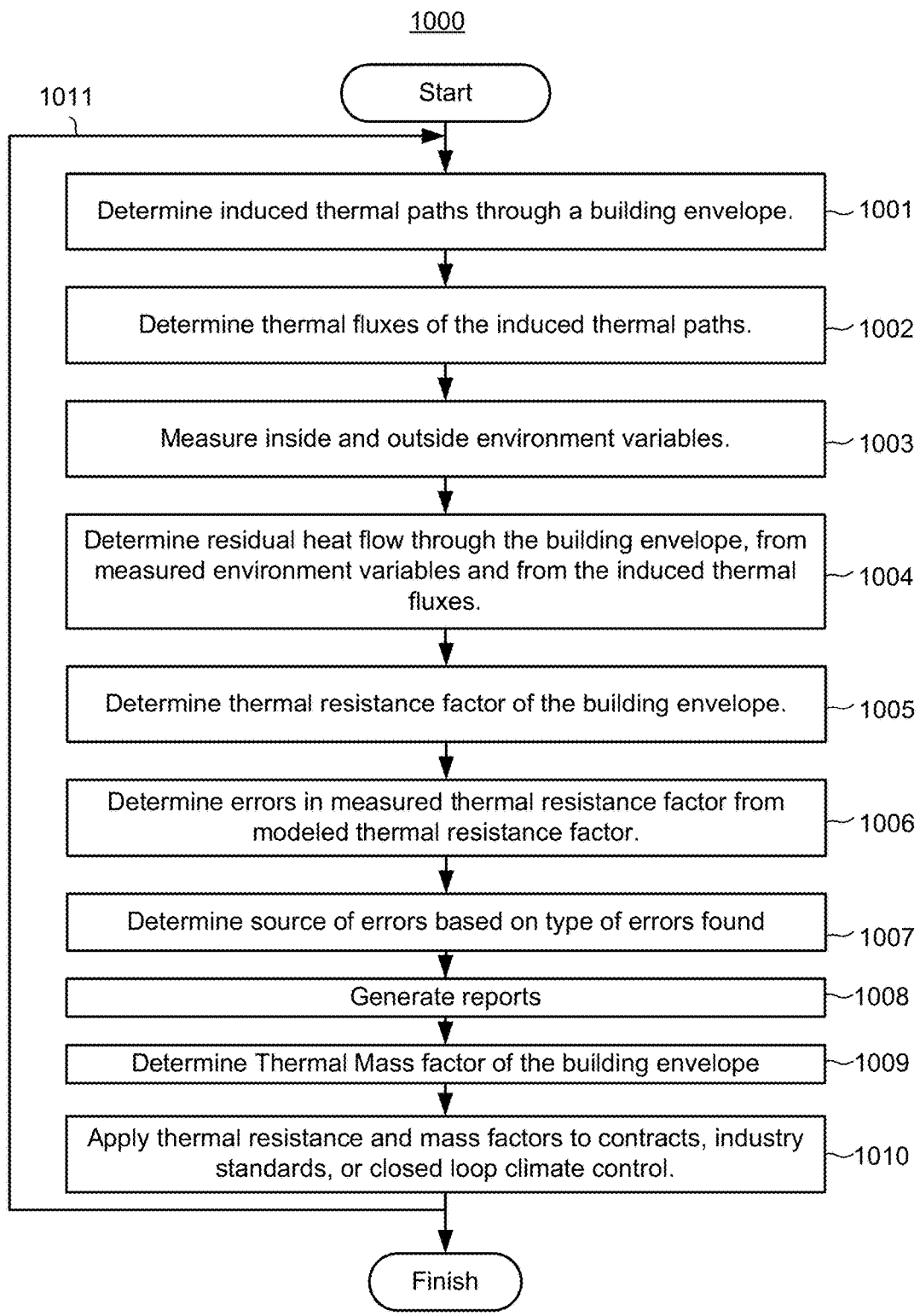
FIG. 10 illustrates a flow diagram of an embodiment for determining heat flow and thermal performance of a building envelope.

Because of errors in the designed thermal performance and the change in performance over time, various embodiments may periodically determine the actual residual heat flow through the building envelope. In one embodiment, heat flow and thermal performance of a building envelope are determined by process 1000 as shown in FIG. 10. In step 1001, induced thermal paths 803-807 are determined as discussed above through monitoring and measurement of the various energy sources entering and leaving the building envelope. In step 1002, resultant induced thermal flows $Q_{EL}$, $Q_W$, $Q_G$, $Q_P$, and $Q_{HVAC}$ are calculated as disclosed above. In step 1003, the inside and outside environments are measured. The measurements may occur periodically at fixed time intervals, may occur in real-time, and may all be synchronized with each other, and with the measurements of the induced heat flows.

In step 1004, residual heat flow is determined from the determined induced thermal flows and by measuring a change in the internal and external environments. For example if the internal environment stays static (e.g., temperature, pressure, and humidity do not change), than the residual heat flow may be determined as $Q_{ENV}=Q_{HVAC}-Q_{EL}-Q_W-Q_G-Q_P$. In other embodiments, residual heat flow $Q_{ENV}$ may be determined by taking into consideration the induced heat flows combined with changes in the internal environment ($T_{ENVI}$, $P_I$, and $H_I$), changes in temperature of internal object 801, and/or changes in temperature of the structure of building envelope 800.

Based on the determined residual thermal flow $Q_{ENV}$ and the measured environments, the actual thermal performance of the building envelope may be determined in step 1005. The actual thermal performance can be calculated as a composite thermal resistance factor, $R_C$, which not only includes an $R_{VALUE}$ characterizing conduction, but also incorporates the other residual thermal paths discussed above due to radiation, convection, and infiltration. In various embodiments, measured $R_C$ may thus be a real-time function of the measured environmental variables. In other embodiments a single $R_C$ value may be determined from the measured parameters, as a value defined over an average period, and/or at predefined environmental conditions. In various embodiments, the measured $R_C$ function or single $R_C$ value may be specified in construction or sales contracts, as a design metric or contractual obligation to meet by one party to the contract.

In step 1006, an error may be quantified between the measured $R_C$ and a modeled Rc based on a modeled design.

In step 1007, a source of the error may be determined based on the type of error found. For example, if the quantified error indicates that thermal conduction was a primary factor in the error, than a builder may conclude that a wall was not assembled according to specification.

In step 1008, reports may be generated which detail the errors. The reports may be provided at the conclusion of construction of the building, periodically during operation of the building to stakeholders, such as owners, building managers, and leaseholders, or provided in real time through, for example, web applications and analytical engines, which may continually calculate and display $R_C$ which may vary based on changing conditions.

In various embodiments, process 1000 may be performed in a static manner, such that one or more of the induced thermal paths may be inhibited. While inhibited, step 1003 may be performed to determine residual heat flow by measuring over time, the inside environment and/or building envelope temperature approaching equilibrium with the outside environment. For example, electric, gas, and water utilities may be cut off from the building, and all ventilation from an HVAC system shut. Once induced heat flow is inhibited, various environmental conditions may be monitored over time, such as $T_{AIRI}$, $H_I$, $B_I$, $P_I$, $T_{ENVI}$, $T_{AIRO}$, $H_O$, $B_O$, $P_O$, $T_{ENVO}$, $W_O$, Time, Date, temperature of the envelope, temperature of inside objects, and/or temperature of outside objects. Where no thermal paths are induced, any heat transfer is typically residual. $R_C$ may then be determined as a function of time during which the two environments approach equilibrium with each other. In one embodiment, the observation of the measured environment may occur over a limited specific interval after the induced heat paths have been shut off. The change in temperature between the inside and outside temperatures over the fixed interval may be specified as the thermal resistance factor, $R_C$. Alternatively, the maximum amount of time for the inside environment to reach equilibrium with the outside environment may be measured within a predetermined threshold. The maximum amount of time to reach equilibrium under the specific conditions may be specified as the thermal resistance factor, $R_C$. In either case, specific initial outside and inside temperatures or other environment variables may be specified.

In other various embodiments, process 1000 may be performed in a dynamic manner, where changes in the induced thermal paths are measured and tracked over time. For example, heat flow from occupants may be tracked in real time so that $R_C$ may be determined under conditions in which the building is often used. In another example, heat flow in a hotel may be tracked in which occupants, electricity, gas, and water are monitored. Determining heat flow through process 1000 may show that excessive heat from shower and/or laundry waste water is being lost from the building envelope. In this sense, process 1000 may be used not only as an audit of the residual thermal performance of the building envelope, but also as an audit of unintended induced heat paths such as drain water. Process 1000, in one embodiment may thus be used to determine how both residual and induced heat paths may be improved.

In both static and dynamic embodiments, process 1000 may be repeated continuously at periodic intervals (e.g., weeks, days, years, months, etc.) through loop 1011 in order to track changes in the thermal performance of a building envelope over time. Changes may be the result of aging of materials, defects in materials, modifications to building structures and systems, or damage to the structures. Changes may also result from changes in the environment (e.g., seasonal changes, solar cycles), or may result from changes in the building envelop and adjacent structures (e.g., new adjacent buildings, changes in occupancy, remodeling, etc.).

In both static and dynamic embodiments, process 1000 may also be applied at different stages of construction of the building envelope. For example, process 1000 may be performed when the outer layer (e.g., brick, concrete) has been completed, but interior build out has not yet been completed. In this way, thermal performance (e.g., thermal resistance and thermal mass) may be evaluated for different components and layers of the building envelope.

In either the static and dynamic embodiments for determining $R_C$, thermal mass of $M_{ENV}$ and $M_I$ may also be determined in step 1009 by monitoring the rise in temperature of building envelope 800 and object 801, and by monitoring any delay in the conductance of heat through from the inside environment and outside environment. For example, using the methods discussed above, induced and residual heat flow may be measured over a fixed period of time and integrated to determine the total amount of heat energy flowing into and out of the building envelope. A composite thermal mass of the building structure, $M_{ENV}$ or $M_I$ (or a composite of the two) may be determined as the difference between the heat flow in and out of the building per degree temperature change of the building structure over the measuring period. We note here that $M_{ENV}$ or $M_I$, may not be thermal mass in strict definition of the term since the temperature of the building structure may vary from location to location within the building envelope. Accordingly, in various embodiments, we use a thermal mass factor $M_C$, which may be based on estimates or averages of heat flow and temperature changes. In one example, $M_C$ may be defined in terms of energy storage of the building envelope with respect to a change in the inside environment temperature (i.e., $\Delta T_{AIRI}$) at equilibrium, given otherwise static environmental conditions.

We have simplified the calculation of the thermal mass $M_{ENV}$, and thermal mass factor $M_C$, however in some embodiments a more complicated measure the building ability to store energy. For example, heat flow $Q_W$ may be more efficiently transferred to the thermal mass $M_{ENV}$ than heat flow $Q_G$. Therefore, in certain embodiments, the thermal mass $M_{ENV}$, and thermal mass factor $M_C$ may be employed which is based on the building envelope's energy storage properties across different environmental conditions, with the different types of heat flows.

The determined thermal resistance factor $R_C$ and thermal mass factor $M_C$ may be applied in various applications in step 1010. In the various applications of step 1010, a one-time measurement of $R_C$ and/or $M_C$, a periodically/continuously measured $R_C$ and/or $M_C$, and/or measured changes in $R_C$ and/or $M_C$ over time may be applied. In one illustrative application, the method of measuring $R_C$ and/or $M_C$ and a specific measured $R_C$ and/or $M_C$ may be specified in construction or sales contracts as a performance metric. Specific damages may further be specified in the contracts based on $R_C$ and/or $M_C$. For example, the contract may specify how to calculate a monetary loss in heating or cooling a building based on the delta between a specified $R_C$ and/or $M_C$ in the contract and a measured Rc and/or $M_C$. In some variations, specified, forecast, or measured environmental variables may further be considered in determining the monetary loss. In another illustrative application, the specific methods for determining $R_C$ and/or $M_C$ may be used as industry standards to compare different structures, or to establish minimum build criteria.

In another variation, resistance factors $R_C$ and thermal mass factors $M_C$ may be collected from a number of buildings may be posted on a website or provided in a publication for providing comparative performance data between buildings. The data may provide $R_C$ and/or $M_C$ or some performance metric derived from these factors, and may organize the data in a manner to rank the building in order of performance. The builders of the buildings may be ranked in a similar manner based on the buildings they construct. The builder's performance may be based on one building or a number of building the builder has constructed. In this manner, historical $R_C$ and $M_C$ data may be used for certification purposes of different builders.

In another illustrative embodiment of step 1010, $R_C$ and/or $M_C$ may be periodically tracked in real-time and used in a closed loop system for autonomously controlling a climate control system (e.g., HVAC) of the building. The periodically tracked $R_C$ and/or $M_C$ may be used in conjunction with measured or forecasted environment conditions, and/or in conjunction with varying cost rates of energy source to control the climate control system. For example, on a night during off-peak rates for electricity, when cold weather is forecast for the next day, the inside environment may be pre-heated such that energy is stored in the thermal masses of the inside object 801 and the building envelope 800 for later dissipation into the inside environment during the day when the building is being occupied and when electricity is at its peak rate. In this example, the determined $R_C$ and $M_C$ may be used to determine the amount, duration, and time to pre-heat the building in order to optimize cost savings. Because $R_C$ and $M_C$, energy rates, and thermal mass inside the building envelope may change over time, the optimum parameters for pre-heating may change as well. $R_C$ and//or $M_C$ may be applied to pre-cooling as well. The determined $R_C$ and/or $M_C$ may show that no cost savings could be achieved because the thermal insulation of the building envelope is insufficient to retain heat for a required amount of time.

In various aspects, dynamically determining $R_C$ and $M_C$ may provide a means for managing use of the building. For example, $R_C$ and/or $M_C$ may be determined on a room by room basis, and show that some areas of the building are inefficient to heat or cool. Building use may be adapted such the spaces with poor $R_C$ and $M_C$ may be used for storage or other purpose where climate control is less important.

Referring to FIG. 1, to perform the steps of process 1000, the induced heat paths may be monitored. Using the electrical heat path as an example, distribution systems may be designed to support specific users, and/or specific tenants of the facility. The design of the distribution system may provide individual tenants and individual employees of the tenant their own supply feed, distribution service, and/or different combinations thereof such that use and/or generation of an energy source by the individual tenant/employee may be uniquely measured using a meter on the tenant's/employee's supply feed or using a sub-meter on the tenant's distribution service. In various aspects, such monitoring of individual tenants or portions of the facility may be used to determine induced heat flow for building envelopes enclosing only a portion within the overall building. In various embodiments, induced heat flow may be monitored on a per tenant basis. For example one tenant may have several more occupants (e.g., self contained heat emitting bodies), and thus induce greater heat flow. Lease rates may be proportioned between tenants based on the relative induced heat flows.

In various embodiments, meter 104, sub-meter 105, and light/load meter 133, may be added to a supply feed, distribution service, or particular load respectively, to measure and record supply and consumption of the energy source over time. From these measurements, analysis may be performed according to certain embodiments to determine the induced heat flow for the building envelope of the entire building or for a smaller volume within the overall building.

Meter 104, sub-meter 105, and sensor 133 may be variously configured. In one embodiment, meters 104, 105, and 133 may include one or more sensors. Various sensors appropriate for measuring the consumption and/or supply of the energy source will differ depending on the energy source being measured. As previously discussed, in the electrical distribution system in system 100, the sensor may be an inductively coupled transformer, a current shunt, or other appropriate sensor for measuring power, electrical current and/or voltage. In other distribution systems for other energy sources such as natural gas and water, appropriate flow meters may be used. For people or automobiles, thermal sensors, thermal imaging systems, imagers, etc. may be used. While meters 104, 105, and 133 are described with respect to electrical power, the various embodiments including the collection and processing of data will be the same regardless of the energy source.

As previously described with respect to meters 104 and 105, sensor 133 may further include a computing platform to operate the sensor, and accumulate pulse inputs (periodic measurements) from the meters and sensors. Meter 133 may include several sensors and accumulate data from several different paths in the distribution system. As an example, meter 133 may include a circuit board with 10 sensor channels for sensors which may each collect pulse data in parallel. A processor on the circuit board may read each channel and accumulate data in the same and/or separate memory devices (e.g. registers) for each channel. The meter 133 may further have a data display which scrolls periodically and/or continuously to illustrate the pulses per channel. In addition to the data display, meter 133 may have buttons or other inputs, which can be used for on-site programming and/or trouble shooting. After on-site programming/trouble shooting, further programming may be from a remote location and/or computer.

In various aspects, sensor 133 may transmit data to a server/workstation or other computing device as previously described with respect to meters 104 and 105. Once collected, the server/workstation may compile the data from each sensor/channel into time sequences of data. The detailed data sequences and graphs associated with individual meters may help pinpoint particular induced thermal paths.

Figure 11:
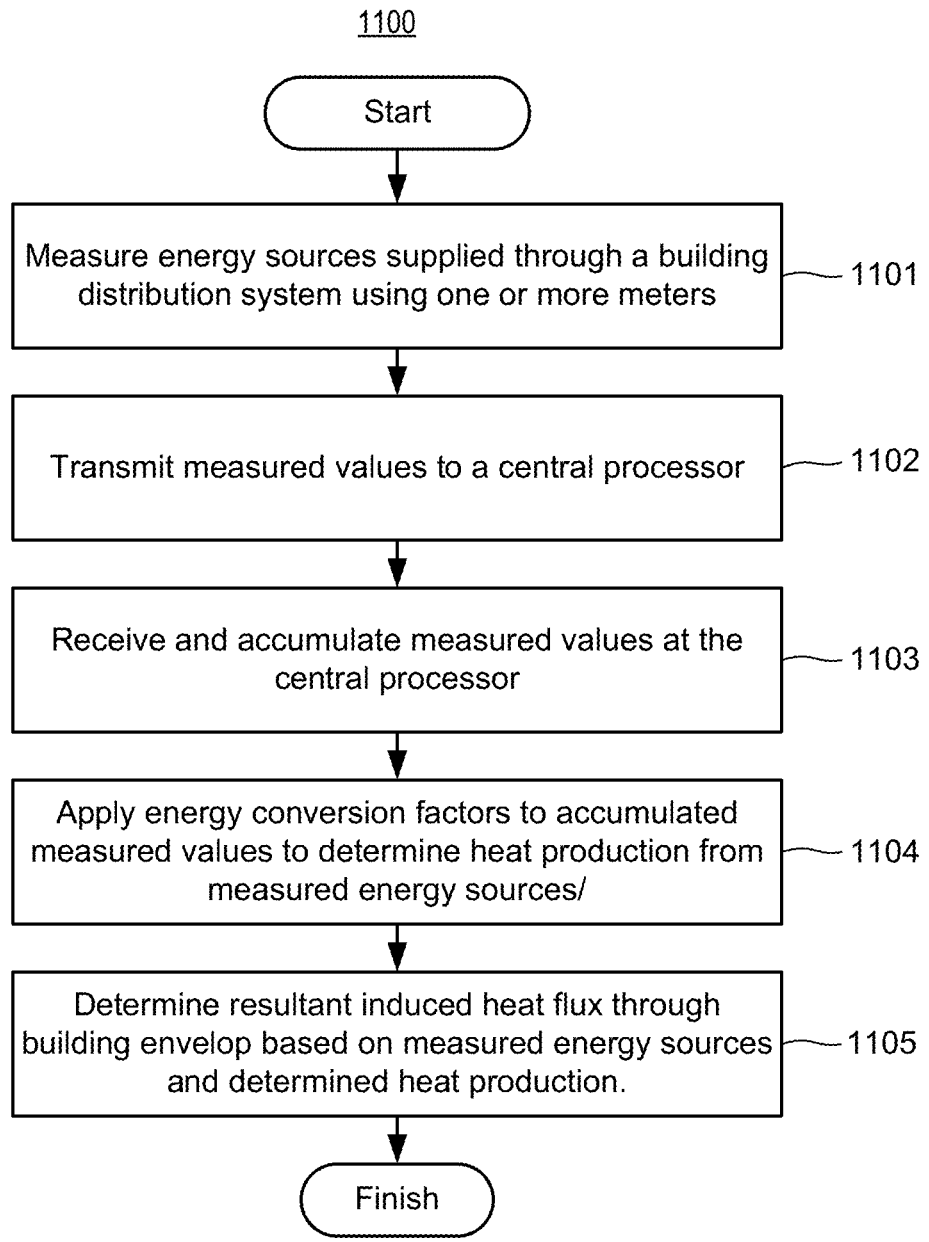
FIG. 11 illustrates a flow diagram of an embodiment for analyzing data sequences to determine induced heat flow from various energy sources.

FIG. 11 illustrates a process, according to some embodiments, to analyze data sequences to determine induced heat flow from various energy sources. Process 1100 starts at 1101 where the supply of an energy source is measured in a distribution system by a meter (e.g. 104). The measured values may then be transmitted from the meter in step 1102, and subsequently received by a processor (e.g. server/workstation 127) in step 1103. Steps 1101, 1102, and 1103 may be accomplished as already described with respect to FIG. 1 and may result in one or more data sequences. Steps 1101, 1102, and 1103 may occur on a pre-determined scheduled basis, as a result of the processor requesting the measured data from the meters, or both. In step 1104, conversion factors of the energy supply to heat production are retrieved from a database. Each conversion factor is a characterization of a loads production of heat from consumption of the energy source. In step 1105, the processor uses the conversion factors and the measured data sequences to determine the induced heat flow through the building envelope. These values may then be used in step 1002 of process 1000.

Figure 12:
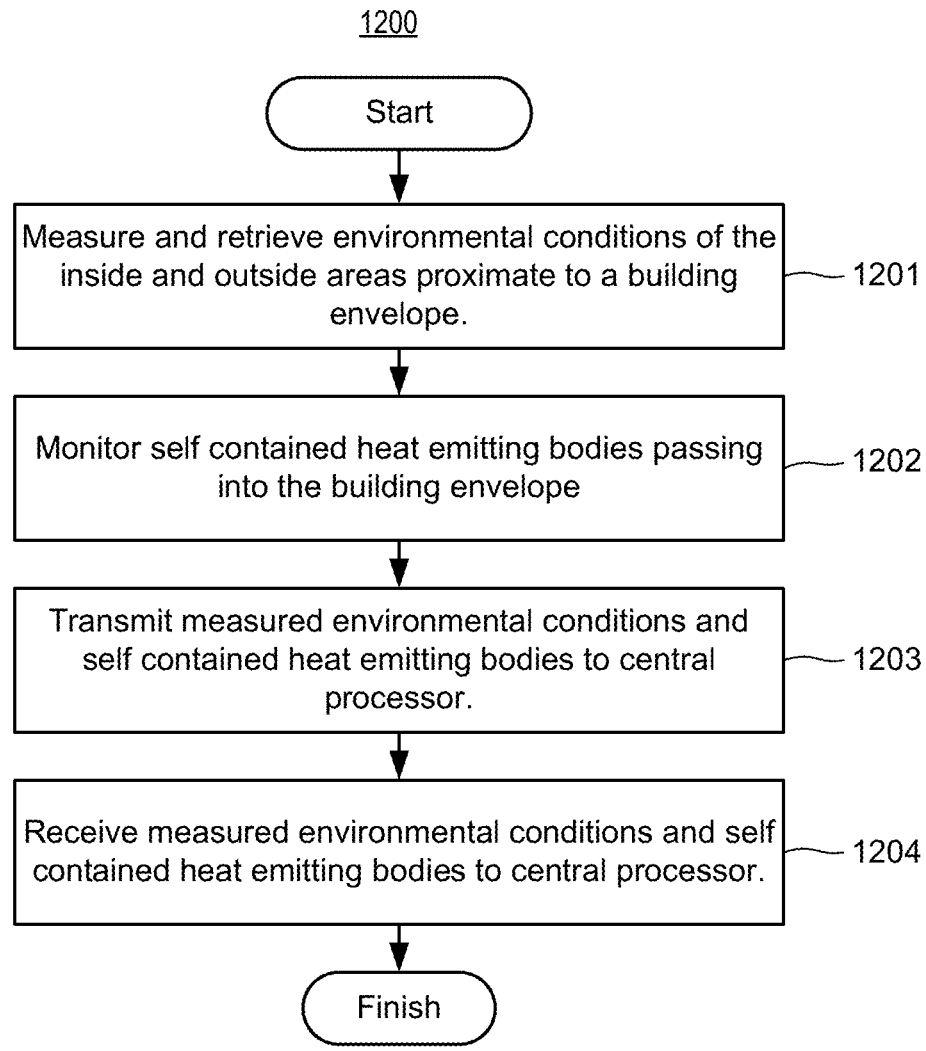
FIG. 12 illustrates a flow diagram of an embodiment for measuring environmental conditions and self contained heat emitting bodies.
Figure 13:
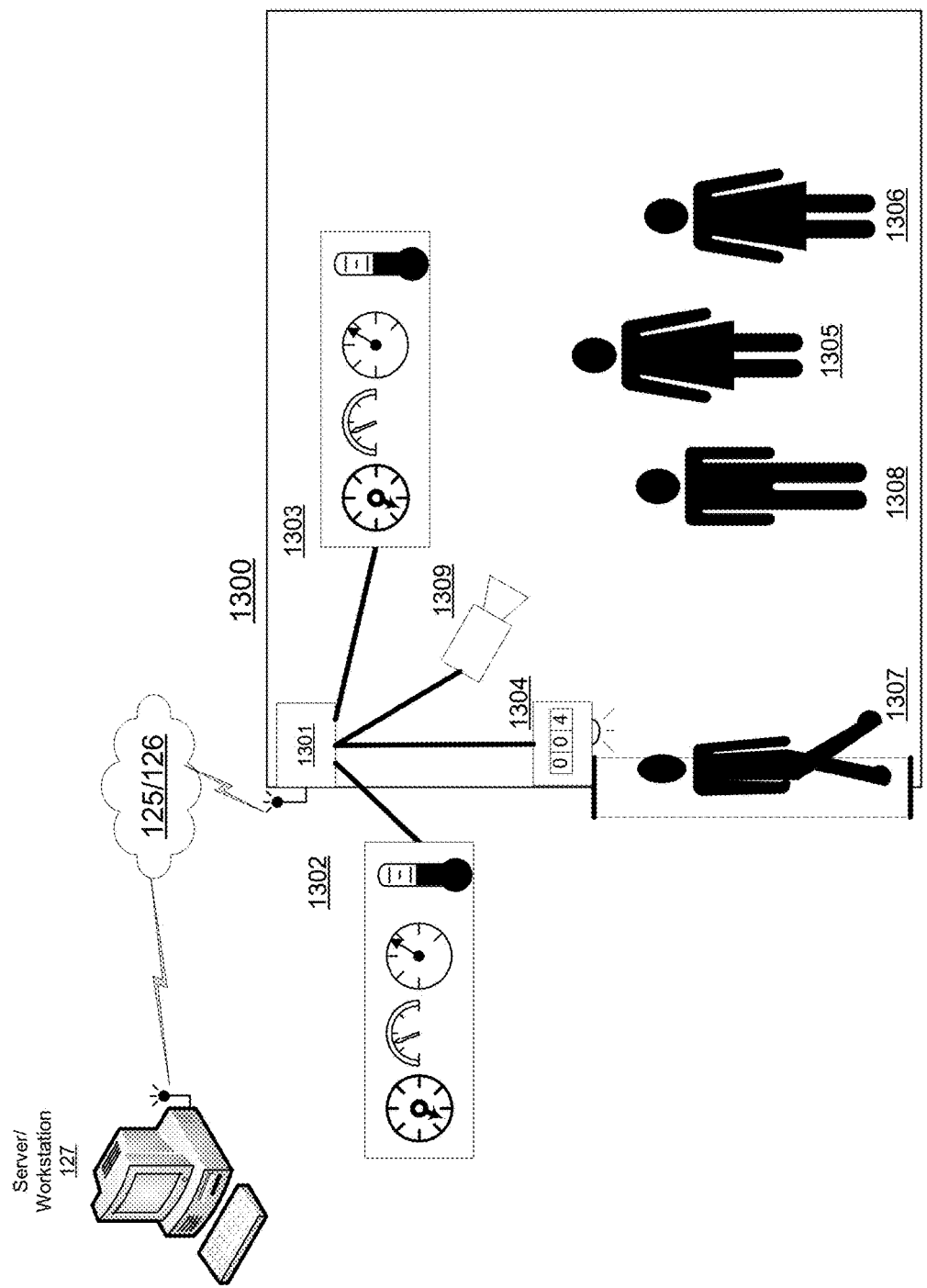
FIG. 13 illustrates an illustrative facility incorporating various sensors which may be used with various embodiments.

Process 1100 may be augmented with additional steps of process 1200 illustrated in FIG. 12, and described with respect to FIG. 13, for measuring environmental conditions and self-contained heat emitting bodies. In this illustrative embodiment, process 1200 starts at 1201 by measuring the environmental conditions illustrated in FIG. 9. For example, as illustrated in FIG. 13, instruments 1303 may be used to measure inside environmental conditions such as such as $T_{ENVI}$, $P_I$, and $H_I$, and instruments 1302 may be used to measure outside environmental conditions such as $T_{AIRO}$, $H_O$, $B_O$, $P_O$, $T_{ENVO}$, and $W_O$. Step 1201 may also include acquiring environmental conditions, weather forecasts and/or other data such as heating and cooling degree day forecasts and utility rate data from external sources such as web servers which compile and distribute such data.

Other operating conditions such as the presence or heat emission of a self contained heat emitting body may be monitored in step 1202. In step 1202, self contained heat emitting bodies 1305 to 1308 within room 1300 may be counted by a sensor 1304. Alternatively, heat signatures of the heat emitting bodies may be detected using thermal imaging device 1309. These sensors may monitor self contained heat emitting bodies as they enter and leave the building, and/or as they move from room to room within the building. FIG. 13 illustrates the heat emitting bodies as people, but the bodies could equally be another animal, an automobile, and/or other object that emits heat generated from internally stored energy.

In various embodiments, instruments 1302 and 1303 may include installed wired and/or wireless temperature transmitters (Infrared, RTD, thermistors, or any temperature measurement platform) on the inside, outside and within the building structure forming the building envelope. These sensors may be arranged in a matrix format and/or may be arranged to measure temperatures at particular points of interest. FIG. 9 details illustrative aspects of temperature instruments within 1302 and 1303.

In FIG. 14, wall 1400 is illustrated with four layers 1401-1405. As previously described, wall 1400 may include an outside concrete layer 1401, next to a thin air layer 1402, followed by a sheathing layer 1403, an insulation layer 1404, and a drywall layer 1405. In various embodiments represented by temperature instrument 1406, temperature sensors may be placed between each material layer making up a wall or enclosure. Temperature instrument 1406 may for example consist of six temperature sensors with each sensor embedded between each of layer as shown (dotted bubble provided for clarity). The sensors are coupled by wires or wireless transmitters through the layers to a measurement device 1407, which may be located on either side of the wall. With temperature instrument 1406 temperature may be detected at multiple depths in the wall simultaneously, periodically, and in real-time. Instrument 1407 may measure temperature data from the sensors periodically and relay the data as discussed with respect to FIGS. 4 and 12.

The sensors of temperature sensor 1406 may be installed during installation of the material layers, or the sensors may be installed by the material manufacture as an integral part of the material layers. For example, in one embodiment a manufacture of rolled fiberglass insulation, may imbed a string of wired sensors spaced and taped along the paper backing of the insulation roll.

In another illustrative embodiment of a temperature instrument, a temperature detection probe 1408 having the ability to measure temperature along incremental distances of the probe is inserted through the multiple layers of the wall. The probe may be a thin cylindrical (or other shape) rod which is inserted into a hole drilled or built into the wall. With the probe, temperature may be detected at multiple depths in the wall simultaneously, periodically, and in real-time. Instrument 1407 may measure or receive temperature data from probe 1408 via wired or wireless connection and periodically relay the data as discussed with respect to FIGS. 4 and 12.

Using the illustrative temperature instruments 1406, 1408, or other similar instrument, a gradient of temperature can thus be detected through the wall, and a more detailed view of the wall's thermal resistance ($R_{VALUE}$), thermal mass (M), thermal resistance factor ($R_C$), and thermal mass factor ($M_C$) can be determined.

In other aspects, instruments 1302 and 1303 may be used during the construction of the building envelope to determine the wall's thermal resistance ($R_{VALUE}$), thermal mass (M), thermal resistance factor ($R_C$) and thermal mass factor ($M_C$). For example, a thermal imaging camera may be used during the construction of a wall. As each layer of a wall is assembled, the thermal surface temperatures of the wall may be measured using the thermal imaging camera, or other thermal sensor. In this way, the contribution of each layer to the walls thermal resistance, thermal mass, or the thermal resistance factor may be independently verified. This may provide an advantage, for example, in detecting faulty or incorrectly installed material before the entire wall is assembled. As a further advantage of measuring each layers contribution, either before or during the completion of the wall, these embodiments are able to pinpoint the cause or causes of under or over thermal performance by a particular component of the construction.

The measurements obtained in process 1200 may be accompanied by meta-data such as time stamps or time intervals such that the operating conditions may later be correlated to data captured in processes 1000 and 1100. In step 1203, the measured environmental and other captured operating conditions are transmitted to the processor. FIG. 13 illustrates an exemplary data collection node 1301 collecting the measured values and transmitting them to the processor in server/workstation 127 through network 125/126, which may be the same as the communication paths describe with respect to FIG. 1, or which may different than, but of the same types as those of FIG. 1. Data collection node 1301, may be the same as meters 104, 105, and 133, or may be some other computing platform operating in the same manner as 104, 105, and 133 over the same types of communication links to transfer data to server/workstation 127. Server workstation 127 may be remotely located, or may be located within the building envelope. In step 1204, the processor in server/workstation 127 receives the transmitted data. The data may then be used in steps 1003 and 1004 of process 1000.

Returning to FIG. 14, plot 1409 illustrates the output of temperature sensors measured over time. Each of the plot line 1410-1415 represents temperature measured by the sensors on each surface of layers 1401-1405. The distance between each plot line represents the temperature difference through a layer. As is shown, the temperature difference through each layer may vary over time at different rates and magnitudes than other adjacent layers, depending on that layers thermal resistance and thermal mass. Using the plots, the thermal resistance and thermal mass may be determined from the plots in the same manner as previously discussed with respect to a single object.

Processes 1000, 1100, and 1200 may be performed by an autonomous processor that works continuously collecting data (e.g., pulse data), and determining $R_C$ and induced and residual heat flow in real-time or near real-time, and generating reports on a fixed schedule (i.e. daily). These reports may be generated in the form of hard-copies and mailed, in electronic form and sent via electronic mail, text message or other form of electronic transfer, or in the form of voice messages sent via a phone line. Further embodiments may allow the reports, including billing information and graphical data to be displayed on any customer interface device, desktop, laptop, PDA, Blackberry and or client internet portal, and may be further provided through a website hosted by the processor. By serving the data from a website, an interested party may be able to view usage and cost data and graphic displays in real-time and/or near real-time. As referred herein, "real-time" refers to updating the usage data as it is collected and calculated with little and/or relatively little delay other than the time it takes to process and/or transmit the data. The amount of delay may be a designed limit on processing time, such that the data may be used in closed loop control such as for use in controlling a climate control system. The delay may also simply be dependent on the resources available in measuring, transferring, and processing the data. For the purposes of this application, "real-time" and "near real-time" refers to the same concept in processing data.

In some embodiments, the signatures of one or more building systems may be used to analyze a building's energy performance and/or to optimize a building's energy efficiency. In these embodiments, by analyzing a signature of a building system's access to a consumable product as measured by, e.g., meter 104 or sub-meter 105 (FIG. 1), an approximate start and stop time of one or more building systems may be determined. Knowing the approximate start and start time of these systems allows a building manager, owner, etc., to adjust the start and/or stop time of the building system to more appropriately coincide with user's use of the particular building system. In such embodiments, the building can ultimately reduce its consumption of the consumable product because the system is not operating during hours when it is not needed and/or efficiently ramps up and down after peak operating hours.

By way of example, in some embodiments a start time of an HVAC system may be adjusted to reduce consumption of a consumable product (e.g., electrical energy). Specifically, for most buildings, an HVAC system is not operated and/or not operated at peak levels, around the clock. That is, the system is only operated/operated at peak levels when a majority of tenants, users, and others are occupying the building such that costs associated with the system may be reduced. In such embodiments, during times when an HVAC system is not operating, an internal temperature of a building will approach an outside temperature and/or be at a reduced temperature depending on the contract with the tenant. Specifically, through the heat transfer principles as described above in connection with FIG. 8 and FIG. 9, heat will permeate through the building's envelope, ultimately causing the internal temperature, $T_{AIRI}$, to approach an outside temperature, $T_{AIRO}$, if the HVAC system is not started back up. Thus, in warm weather, the internal temperature $T_{AIRI}$ of a building will continually rise when the HVAC system (e.g., the air conditioning system) is not operating. Similarly, in cool months, the internal temperature $T_{AIRI}$ of the building will continually drop when the HVAC system (e.g., the heating system) is not operating.

However, in order to return the building to a desired operating temperature when a majority of tenants, users, and others ultimately return, the HVAC must be activated in advance of an occupancy time. Used herein, occupancy time broadly refers to a desired time by which to have an internal temperature of a building at a desired occupancy temperature. In commercial leases, this may be specified in the lease agreement. Accordingly, a landlord may agree to have the building cooled/heated to an agreed temperature by, e.g., 7:30 AM each morning. In other embodiments, an occupancy time simply refers to a time by which a landlord, owner, manger, etc., wants the building cooled/heated to a specified temperature. In order to ensure the internal temperature of the building is at the desired occupancy temperature by this occupancy time, the HVAC system will need to be started in advance of the occupancy time in order to sufficiently heat or cool the air inside.

Traditionally, start times for building systems have been largely arbitrary. Returning to the example of HVAC systems, the system may be programmed to start at the same time each day and run until a desired internal temperature is met. This arbitrary start time may be a time well before the occupancy time which the owner/manager believes is necessary to reach the desired temperature by the occupancy time. For example, an owner/manager may program the start time as 5:00 AM each morning. Regardless of the outside temperature, the building will thus start an HVAC system at 5:00 AM and run until a desired internal temperature is met, at which time the system will reach a steady state to maintain the temperature. In typical situations, the system turns off once the desired temperature is reached and then restarts at some later time depending on numerous parameters. On some days, the desired internal temperature is far from the external temperature (e.g., particularly hot or cold days) and thus a 5:00 AM start time may be appropriate such that the HVAC system has ample time to reach the desired occupancy temperature by the occupancy time. However, on other days, the desired internal temperature may be much closer to the outside temperature (e.g., mild days) and thus such an early start time may be inefficient. More specifically, starting the HVAC system at 5:00 AM on these days may result in heating/cooling the building well ahead of what is necessary to reach the desired temperature by the occupancy time. In still further embodiments, the predicted outside temperature in addition to the current outside temperature may be considered particularly where extended periods are required to return the building to the desired temperature.

According to some aspects of the disclosure, a signature of one or more building systems' access to a consumable product may be analyzed to determine the building's energy performance and/or determine an appropriate start time for the one or more building systems. Again referring to FIGS. 1-2, in these embodiments, access to a consumable product may be measured by one or more meters 104 or sub-meters 105. A curve, such as graph 200, of the access may be analyzed by, e.g., a processor in server/workstation 127, to determine if one or more building systems are being started too early. Returning to the example of an HVAC system, the HVAC system may operate on, e.g., electricity. Accordingly, a signature of the system's access to electricity may be analyzed to determine approximately when the HVAC system stops and/or reaches a steady state condition (corresponding to a time at which the building reaches a desired occupancy temperature). This time may then be compared to a desired occupancy time, and, if this time is well in advance of a desired occupancy time, a start time for the system in subsequent days may be adjusted such that the system operates more efficiently. Thus, the control system may include a feedback control loop utilized to maximize efficiency based on actual experience in real world situations. This feedback control loop can learn from past experience based on current outside temperature, outside and inside temperature trends during the cycle, final outside temperatures, and predicted outside temperatures from, for example, a weather forecast. In some embodiments, one or more pattern matching algorithms, artificial intelligence routines, regression analysis, intelligent agents, other learning algorithms, and/or feedback control loops may be employed to maximize the efficiency of the heating and cooling cycles. Further, the system may choose between different heating and cooling options to determine how may resources to apply to the system, whether to switch to an alternative heating/cooling system such as gas, heat pump, outside air intake, and/or air conditioned air.

In some embodiments, one or more of the above-described methods may be used to isolate a signature of a building system (e.g., an HVAC system) such that the isolated signature may be analyzed to determine the stop time of the system. In such an embodiment, the signature of, for example, one or more components of the HVAC system may be analyzed as discussed herein to determine to the stop time (e.g., approximate time at which occupancy temperature was reached). As discussed above, one or more control systems may include a feedback control loop utilized to maximize efficiency based on actual experience in real world situations on each isolated HVAC system. This feedback control loop can learn from past experience on each isolated HVAC and/or subsystem based on current outside temperature, outside and inside temperature trends during the cycle, final outside temperatures, and predicted outside temperatures from, for example, a weather forecast. In some embodiments, one or more pattern matching algorithms, artificial intelligence routines, regression analysis, intelligent agents, other learning algorithms, and/or feedback control loops may be employed for each HVAC system and/or subsystem to maximize the efficiency of the heating and cooling cycles. These units may also interface directly to control systems in the HVAC systems and/or subsystems using any suitable technique and/or interface such as a wireless and/or wired connection including a serial port, fire wire, and/or other suitable interface.

In still further embodiments, a signature characterizing the system's HVAC access may not be isolated from, e.g., a signature of the overall building. Specifically, for pre-occupancy times (e.g., times when many of the tenants, users, and others are not using the building) the predominate system consuming the consumable product may be, e.g., an HVAC system. Thus, if graph 200 from meter 104 (representing the entire building's access to the consumable product) is smoothed (using, e.g., one or more low pass hardware and/or software filters and/or other smoothing and/or isolating technique such as other submeters), the graph may be configured to have an overall positive slope when the HVAC system is accessing the consumable product (corresponding to the HVAC system consuming electrical power) which may terminate at the moment the HVAC system reaches the desired temperature and moves into a steady state condition (e.g., stops due to meeting the desired temperature). Thus, by looking at graph 200 during pre-occupancy times, a time when the slope of the signature becomes negative may be interpreted as an approximate stop time for the HVAC system without the need to actually measure via a submeter the signature of the HVAC system. If this stop time is well in advance of a desired occupancy time, then the system is operating inefficiently. Put another way, when the HVAC system stops, the building is up to temperature. Thus, if this time is well in advance of a desired occupancy time, the building will have been heated/cooled prematurely (because many of the tenants, users, etc., are not yet occupying the building). This can be estimated in certain examples from the techniques described herein such as graph 200. Some embodiments may use signatures from multiple days to determine the thermal performance of a building. In these embodiments, the determined thermal performance may be used to determine, e.g., an appropriate start time for a building system (e.g., HVAC system). By analyzing the signatures for multiple days under a variety of operating conditions (e.g., differing outside start and stop temperatures), predicted temperatures, and/or thermal properties of the building, a control system may estimate the optimal start/stop times for the HVAC system. For example, in one embodiment a plurality of ramp-up times for a corresponding plurality of outside temperatures and/or predicted outside temperatures may be analyzed to approximate thermal properties of the building (e.g., an approximate R-value). Thus, by analyzing data for a continuous, variable, fixed, and/or sliding window period of time (e.g., two weeks), inherent thermal properties of a building may be approximated and utilized when determining appropriate future ramp-up times as discussed more fully below. The period of time may be refined and updated over time and/or tracked to determine any anomalies such as tenants blocking open doors to terraces. Once the approximate stop time of the system is approximated for one or more days, an appropriate start time for the system in subsequent days may be determined in order to increase the energy efficiency of the building.

Figure 15:
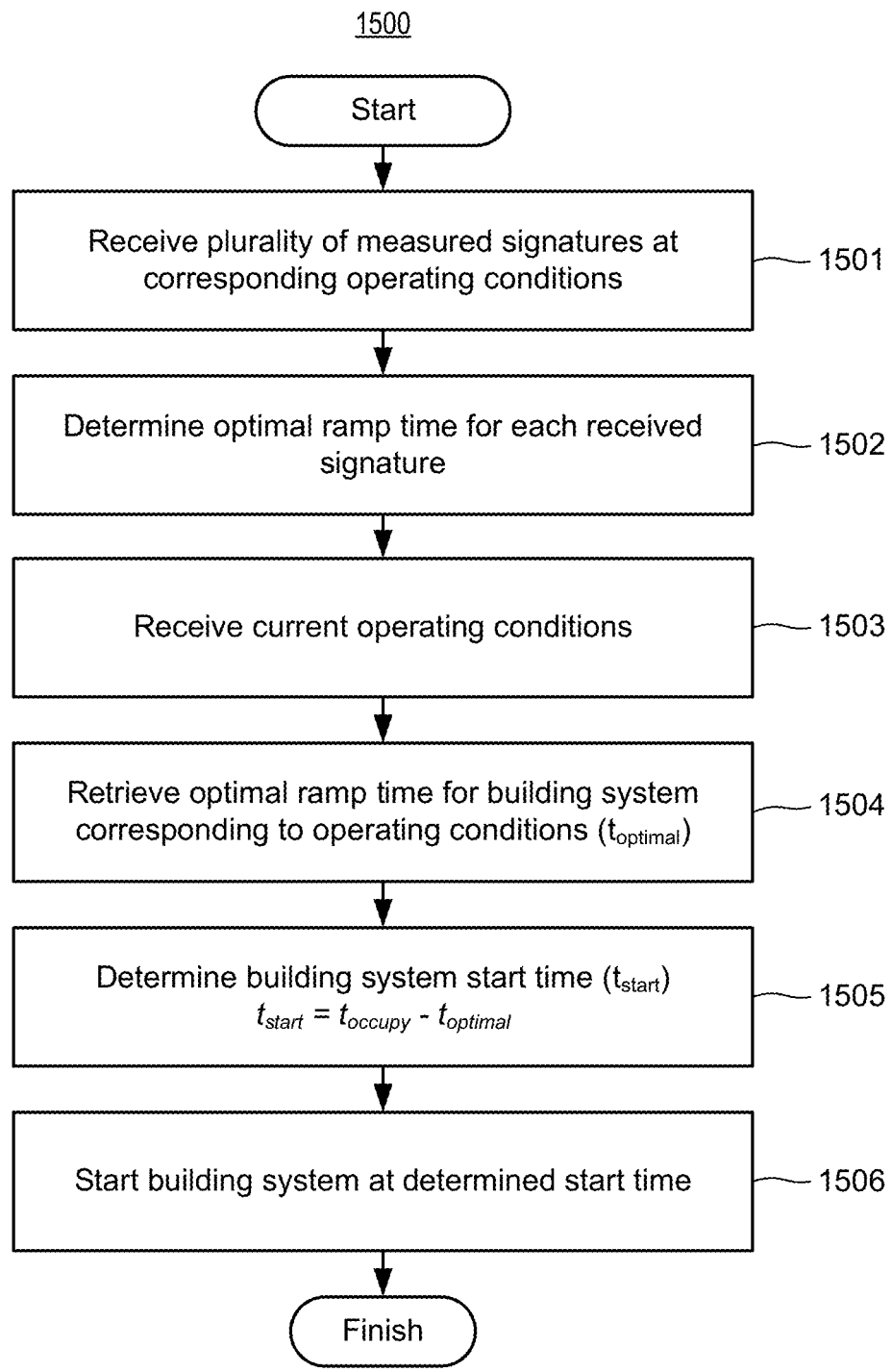
FIG. 15 illustrates an illustrative lookup table used in conjunction with determining a building start time score.

Referring to FIG. 15, an exemplary process 1500 is shown which may be variously implemented such as for controlling a start time of a building system according to one or more aspects of the disclosure. At step 1501, a plurality of measured signatures (e.g., each at corresponding operating conditions such as inside temperature, outside temperature, predicted temperature) may be determined. Each signature may characterize various operating characteristics such as one or more building systems' access to a consumable product (e.g., an HVAC system and/or subsystem) during (e.g., a fixed, sliding, variable and/or predetermined) time interval for the corresponding operating condition. For example, a signature characterizing an HVAC system's access to electrical power during a predetermined time interval prior to an occupancy time of the building may be analyzed for a plurality of days (corresponding to a plurality of operating conditions) in order to determine optimal predicted parameters which may be utilized to operate the HVAC system. Optionally, the signature(s) may be further isolated from one or more signatures characterizing more than one users' access to the consumable product (e.g., measured at meter 104) at step 1501.

Using these signatures, optimal ramp times for each corresponding signature may be estimated at step 1502. The estimated optimal ramp time may refer to a time needed for the system to effectively operate before an occupancy time. Whether the prediction was accurate may be determined and this information may be fed back into the feedback control system in exemplary embodiments to achieve a better prediction for future operations. For example, in the case of an HVAC system, the optimal ramp time may include the time needed for the HVAC system to appropriately heat/cool the internal temperature of the building prior to the occupancy time of the building for the given operating conditions (e.g., outside temperature, predicted temperature, heating, cooling, which HVAC system/subsystem is being utilized) without heating/cooling the building too far in advance of the occupancy time. In some embodiments, the optimal ramp time may be the exact time needed, nearly exact time needed and/or an approximation of the time needed for the building system to heat or cool a building by the desired occupancy time at a corresponding outside temperature. In other embodiments, the optimal ramp time may refer to the time needed to heat or cool the building by the desired occupancy time plus a built-in "buffer" (e.g., 30 minutes, 60 minutes, etc.). The buffer time may be included in the control system and/or adjusted based on contractual requirements. For example, the feedback control system may determine that there are instabilities in the feedback loop so that it is not possible to predict the exact time in which to start the ramp up. In these circumstances, where past experience was not accurately able to predict the start time with precision, the feedback control system may determine an amount of desired buffer time. This time may be as little as one minute or may be 30 minutes or more. In any event, in embodiments where a buffer is utilized, it may be either automatically and/or manually configured. In these embodiments, the buffer may be utilized to help ensure the building will reach a desired temperature before the occupancy time even if there are unforeseen outside temperature changes (e.g., a sudden drop of outside temperature thus requiring more time for an HVAC system to properly heat a building) and/or someone left a door and/or windows open interfering with the desired ramp time. The optimal ramp time in certain embodiments may be equal to a time interval between a determined stop time of a building system and a determined start time of the building system plus any desired buffer.

At step 1503 the current operating conditions are received. For example, the current outside temperature may be received. As presented above, on particularly cool or warm days, a building HVAC systems will require more time to heat/cool the building than on more mild days. Accordingly, at step 1503 the current operating conditions (e.g., outside temperature) is retrieved such that an optimal ramp time (e.g., an appropriate time to start the system ahead of an occupancy time) can be determined at step 1504. In some embodiments, a lookup table or other suitable storage means may be utilized to store an optimal ramp time for each corresponding operating conditions, and at step 1504 the received current operating conditions will thus be compared to exemplar operating conditions (e.g., outside temperature) stored in the lookup table and the corresponding optimal ramp time of exemplar ramp times will be selected. In other embodiments, an appropriate optimal ramp time may be determined mathematically. Specifically, using a plurality of received signatures for a plurality of corresponding operating conditions, approximate thermal properties (e.g., an approximate R-value, etc.) for the building may be determined and utilized to determine optimal ramp times for subsequent days according to the specific operating conditions At step 1505, a building system start time may be determined using suitable techniques discussed herein such as the predetermined occupancy time and the determined optimal ramp time. In this example, the building system start time may be the desired occupancy time less the determined optimal ramp time. Finally, at step 1506, the building system may be started at the determined start time, such that the building system will efficiently bring the building to an appropriate occupancy temperature by a desired occupancy time. Returning to the example of an HVAC system example, the HVAC system may be started at the determined start time such that it is given enough time (plus any applicable buffer as described herein) to heat/cool the building such that the building reaches a desired occupancy temperature by the desired occupancy time.

Similarly, aspects of this disclosure may be used to determine one or more building systems' (e.g., HVAC system) access to a consumable product (e.g., electrical power) at an end of an occupancy period (e.g., the end of a day), and accordingly analyze the one or more systems' energy performance with respect to stopping the one or more system each day. More specifically, knowing a predetermined departure time (e.g., a time of the day after which the building no longer must be kept at a desired temperature) a signature of the one or more systems' access to the consumable product may be analyzed to determine a time at which to stop a building system for the remainder of the day.

According to some aspects of the disclosure, metrics associated with one or more building systems' access to a consumable product may be determined to quantify the building's energy performance. For example, in one embodiment a controllable load may be determined to quantify the building's energy performance. A controllable load may be variously configured. In one embodiment, the controllable load may be one which a building owner, manager, etc., may eliminate either by turning off unneeded systems and/or allocating a consumption of a consumable product to an appropriate user through the use of one or more sub-meters 105.

In one embodiment, a controllable load may be determined by first determining a theoretical unoccupied load. A theoretical unoccupied load may be variously determined but in one example it may be a minimum theoretical consumption of a consumable product obtainable during a predetermined period of time (e.g., an unoccupied time of the building). For example, a theoretical unoccupied load may be determined overnight in a building where most or all of the tenants only occupy the building during the day. The theoretical unoccupied load in this example represents access to a consumable product by systems that cannot be eliminated due to requirements by building code or for other similar reasons. For example, "Exit" signs may consume, e.g., electrical power, however building code may require these signs remain on even during periods of no expected occupancy. Other systems may be required to remain on as well, such as, e.g., emergency lighting and the like, and/or some minimum HVAC activity to keep the building above some minimum temperature as determined by contract or building codes. In this example, the next step is to calculate an actual unoccupied load. An actual unoccupied load may be variously defined but in this example it may be determined as the amount of a consumable product accessed during the predetermined period of time when the theoretical unoccupied load is determined (e.g., overnight). The actual unoccupied load may represent the amount of consumable product actually accessed during this time. For example, computer server room 114 may operate twenty-four hours a day, seven days a week. Thus, even during "unoccupied" periods, computer server room 114 may still access a consumable product (e.g., electrical power). Thus, in most situations, an actual unoccupied load will be greater than a theoretical unoccupied load.

Next, any sub-metered loads may be taken into consideration to isolate them from, for example, the HVAC system.

In this way, any access of a consumable product above the theoretical unoccupied load may be allocated to the user responsible for the access.

In this example, the controllable load represents the total amount of consumable product accessed that is not attributable either to systems that cannot be turned off (e.g., "Exit" signs, emergency lighting, etc.) or to sub-metered access by one or more users, e.g., server rooms. This load is considered "controllable" because it represents opportunity. More specifically, a building owner, manager, etc., can either turn off systems accessing a consumable product that are not required to remain on during a period of no occupancy and/or use one or more sub-meters 105 to meter access to the consumable product by one or more users and accordingly allocate the cost of the consumable product to the responsible user. In this example, the controllable load may be equal to the actual unoccupied load less the sum of the theoretical unoccupied load and the sub-metered load. This controllable load may be presented in any desirable unit for quantifying access to a consumable product, such as, e.g., kWhr, Therm, Gallons, Lumens, etc. Thus, according to some aspects of the disclosure, access to a consumable product can be analyzed to determine, for example, a controllable load which can be used to analyze a building's energy performance.

In addition to or in place of a controllable load, a controllable load score may be determined in other examples. A controllable load score is related to the concept of controllable load in that it compares a theoretical unoccupied load and a sub-metered load with an actual unoccupied load to determine a building's energy performance. In some examples, a controllable load score may be presented as a dimensionless value (e.g., a percentage) such that a user, building owner, manager, etc., may understand a current usage of a consumable product in terms of a goal (e.g., an ideal usage of the consumable product) during a period of no occupancy.

In these embodiments, the controllable load score may compare the sum of the theoretical unoccupied load and the sub-metered load to the actual unoccupied load. For example, during a period of no occupancy a building manager would ideally want to turn off all systems which consume a consumable product that are not either (1) required to remain on (according to, e.g., a building code) and/or (2) sub-metered and allocated back to a responsible user. Accordingly, if the owner, manager, etc. is successful in eliminating all consumption of a consumable product that is not required to remain on (i.e., the theoretical unoccupied load) and/or allocated back to a user (i.e., a sub-metered load), a desirable controllable load score may be reached. In one embodiment, a controllable load score of 1 (e.g., 100%) may be reached. The controllable load score may be variously calculated. In one example, the controllable load score may be calculated as the sum of the theoretical unoccupied load and the sub-metered load divided by the actual unoccupied load. In many practical applications, the controllable load score will not be perfect. Accordingly, the building's controllable load score would be less than 1, or, rather, less than 100%. By expressing the controllable load in terms of a dimensionless controllable load score, a user, building owner, manager, etc., may better understand the building's energy performance. Thus, a building receiving a controllable load score of, e.g., 98% may be easily understood to be a rather efficient building with respect to controllable load, while a building receiving a controllable load score of, e.g., 48% may be easily understood to be a rather inefficient building. These dimensionless load scores are much easier for a building manager to understand and manage. They are easy to compare between buildings and projects.

Figure 16:
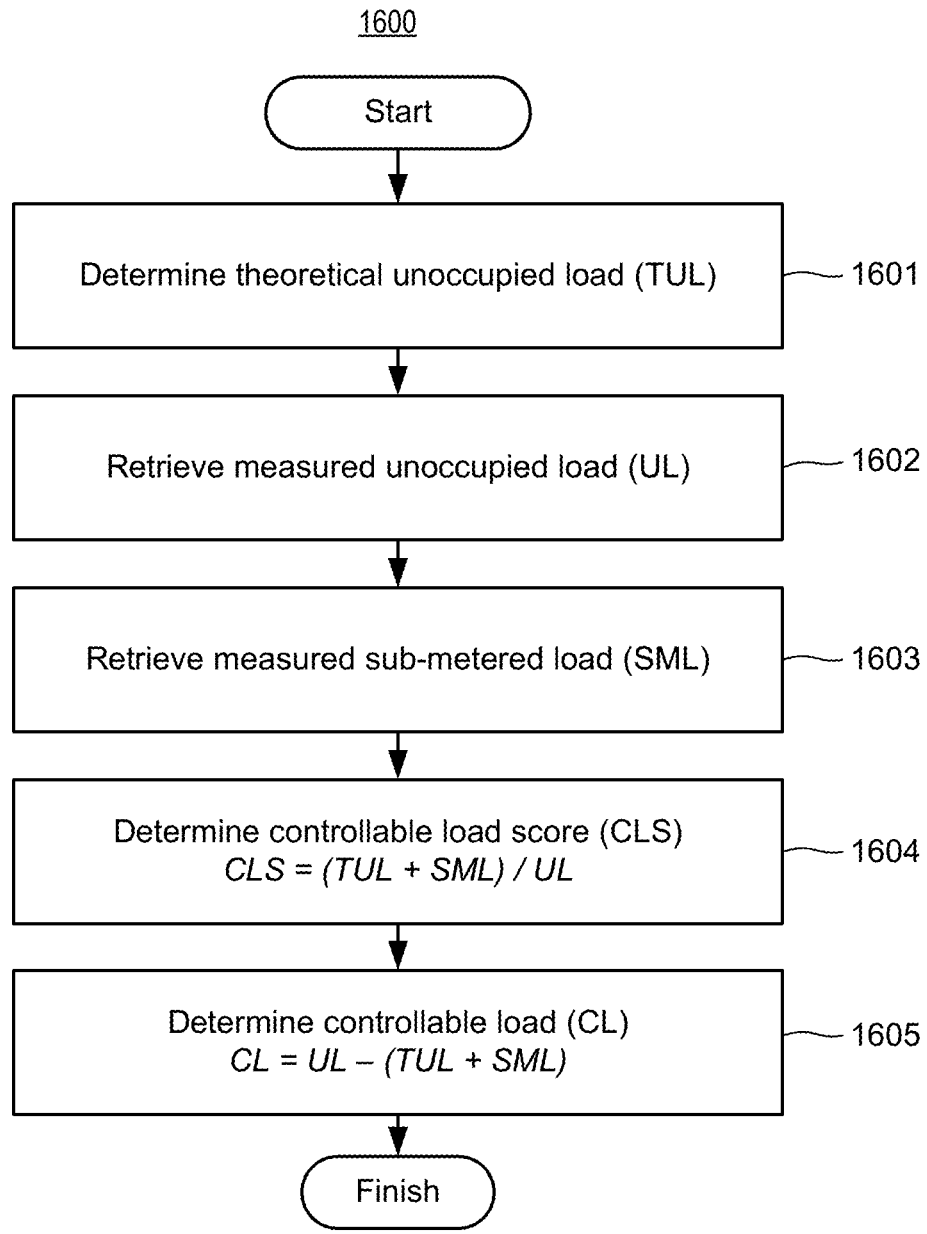
FIG. 16 illustrates a flow diagram of an embodiment for determining a controllable load and/or a controllable load score of a building.

Referring to FIG. 16, an exemplary process 1600 is illustrated for determining a controllable load and/or a controllable load score according to one aspect of the disclosure. In step 1601, a theoretical unoccupied load of the building is determined. At step 1602, a measured unoccupied load is retrieved, e.g., from a contemporaneous and/or previous measurement. This unoccupied load may be, e.g., an output reading from meter 104 during the predetermined time period and/or an unoccupied load calculated using other techniques such as those discussed herein. At step 1603, in this example suitable available sub-metered loads are retrieved. The retrieved sub-metered loads in this example may characterize one or more users' access to the consumable product (which may ultimately be allocated back to the respective user) during the predetermined time period as measured by one or more sub-meters 105. In step 1604, a controllable load score may be determined in this example using the determined theoretical unoccupied load and the retrieved measured unoccupied load and measured sub-metered load. In some embodiments, the controllable load score may be determined using the formula presented in step 1604 (i.e., the sum of the theoretical unoccupied load and the sub-metered load divided by the measured unoccupied load). Finally, at step 1605, a controllable load may be determined. In some embodiments, the controllable load may be determined using the formula presented in step 1605 (i.e., the measured unoccupied load less the sum of the theoretical unoccupied load and the sub-metered load).

In still further embodiments, in addition to a controllable load score, a building start time score may be determined to quantify a building's energy performance. As presented above, certain building systems (e.g., a building's HVAC system) consume large quantities of a consumable product (e.g., electrical power). When these systems are started well in advance of other comparative buildings similarly situated, a building is operating inefficiently. However, in order to quantify how well the building system's actual start time is compared to, e.g., an optimal start time, a building start time score may be determined. More specifically, the building start time score quantifies how close to a building occupancy time the building attains an occupancy temperature. As with the controllable load score, the building start time score may be a dimensionless value, and may be presented, e.g., as a percentage. This enables building managers to determine which buildings in their portfolio are efficient and which buildings are inefficient. It also enables a building manager to determine which buildings are candidates for further review and analysis to fix issues associated with the building.

Returning to the example of an HVAC system using electrical power, a slope of graph 200 (representing access to electricity) may be variously analyzed. In some examples, the slope may change (e.g., becomes negative) at an approximate time the building has reached occupancy temperature. In this example, if the slope becomes negative well before an occupancy time, there is a long period of "unused" ramp time (i.e., the period of time between when the system achieves an occupancy temperature and a desired occupancy time). In such an embodiment, the system was started too early because the building is being maintained at an occupancy temperature even before the building is occupied. This unused ramp time may be compared to a lookup table containing exemplar unused ramp times and corresponding building start time scores in order to determine a building start time score.

Figure 17:
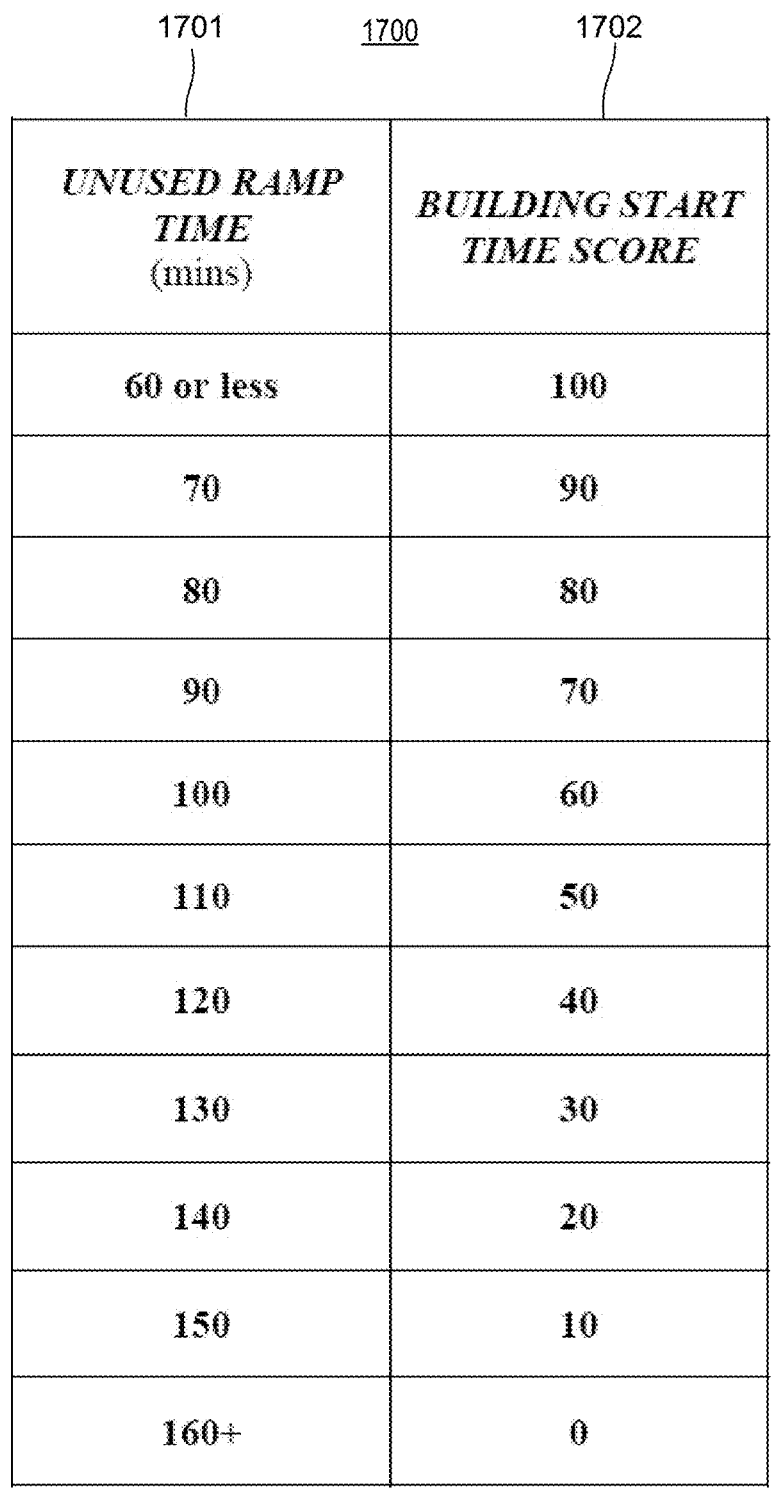
FIG. 17 illustrates a flow diagram of an embodiment for determining a building start time score and/or a weighted energy score of a building.

FIG. 17 illustrates one embodiment of a lookup table 1700 that may be utilized according to one aspect of the disclosure. Specifically, lookup table 1700 includes a first column 1701 comprising exemplar unused ramp times, and a second column 1702 comprising exemplar building start time scores. Lookup table 1700 may be stored in any suitable location well known to those skilled in the art, such as, e.g., at server/workstation 127. Lookup table 1700 may be used as described above to determine a building start time score, with a score of 100 being optimal. As seen in lookup table 1700, if a particular building has an unused ramp time of, e.g., 90 minutes, the building may receive a building start time score of 70. If the particular building instead has an unused ramp time of 160 or more minutes, the building may receive a building start time score of 0. Although lookup table 1700 contains exemplar unused ramp times in increments of ten minutes, one skilled in the art will appreciate that the exemplar unused ramp times in first column 1701 and the exemplar building start time scores in second column 1702 may be extrapolated to determine an appropriate building start time score when a determined unused ramp time falls between exemplar unused ramp times. For example, if a particular building has an unused ramp time of 93 minutes, the building may receive a building start time score of 67. Further, the table contained in FIG. 17 is exemplary and other tables and dimensionless characterizations may be utilized.

Further, one skilled in the art, given the benefit of this disclosure, will understand that the values contained in lookup table 1700 are for illustrative purposes only, and that, in practice, these values may vary without departing from the scope of this disclosure. For example, in some embodiments, an optimal building start time score (i.e., 100) may only be achieved if the building has no unused ramp time. In such an embodiment, rather than 60 minutes of unused ramp time corresponding to a building start time score of 100, 0 minutes would correspond to a building start time score of 100. Further, although the relationship of unused ramp time to building start time score in lookup table 1700 is linear (i.e., for every minute over 60 of unused ramp time, the building start time score decreases by one), in other embodiments the relationship between the unused ramp time and building start time score may not be linear. For example, in some embodiments, the relationship may be, e.g., quadratic, such that for each additional minute of unused ramp time, the building start time score drops exponentially.

In some embodiments, an appropriate building start time score may be found mathematically without the use of lookup table 1700. For example, one skilled in the art will appreciate that the information contained in lookup table 1700 may be expressed using a system of equations. Specifically, in these embodiments, for a determined unused ramp time (URT) an appropriate building start time score (STS) may be found using the following system of equations:

For $URT \leq 60 \rightarrow STS=100$

For $60 < URT < 160 \rightarrow STS=160-URT$

For $URT \geq 160 \rightarrow STS=0$

Accordingly, a processor at, e.g., server/workstation 127 may mathematically determine an appropriate building start time score by processing the unused ramp time using the above set of equations rather than using the lookup table 1700. In any event, given an unused ramp time as determined from one or more signatures characterizing a building system's access to a consumable product, an appropriate building start time score may be determined quantifying one aspect of the building's energy performance.

In addition to the controllable load score and the building start time score as presented above, in still further exemplary embodiments the system may utilize a weighted energy score. A weighted energy score may be variously configured, but in one embodiment may be a single metric incorporating both the controllable load score and the building start time score such that the building's overall energy performance may be presented in an easily understood metric. In some embodiments, the weighted energy score may be an average of a building's controllable load score and its building start time score. In such embodiments, the weighted energy score would be equal to the sum of the building start time score and the controllable load score divided by two. By way of example, if, using any of the aforementioned methods, a particular building is found to have a building start time score of 70 and a controllable load score of 80, the building's weighted energy score would be 75 (i.e., the sum of 70 and 80, 150, divided by two). This weighted energy score may provide a building owner, manager, etc., with a useful metric to quantify her building's overall energy performance taking into account both controllable loads and start times of building systems (e.g., HVAC systems) and thus to form useful comparisons between buildings.

In some embodiments, the weighted energy score may instead comprise a weighted average of the above two metrics. That is, in some embodiments a building owner, manager, etc., may put more emphasis on their ability to control, e.g., a building system's start time rather than a building's controllable load, and may accordingly desire a metric which weighs the building start time score more heavily than a controllable load score. By way of example, the weighted energy score may weigh the building start time score at, e.g., 75%, and accordingly the controllable load score at 25%. In such an embodiment, the weighted energy score would be the sum of 0.75 multiplied by the building start time score and 0.25 multiplied by the controllable load score. Thus, if a building receives a building start time score of 70 and a controllable load score of 80, the weighted energy score in this embodiment would be 72.5. Those skilled in the art, given the benefit of this disclosure, will appreciate that any relative weighting of each individual score (i.e., X % of building start time score and Y % of controllable load score, where X+Y=100%) may be employed without departing from the scope of this disclosure.

Figure 18:
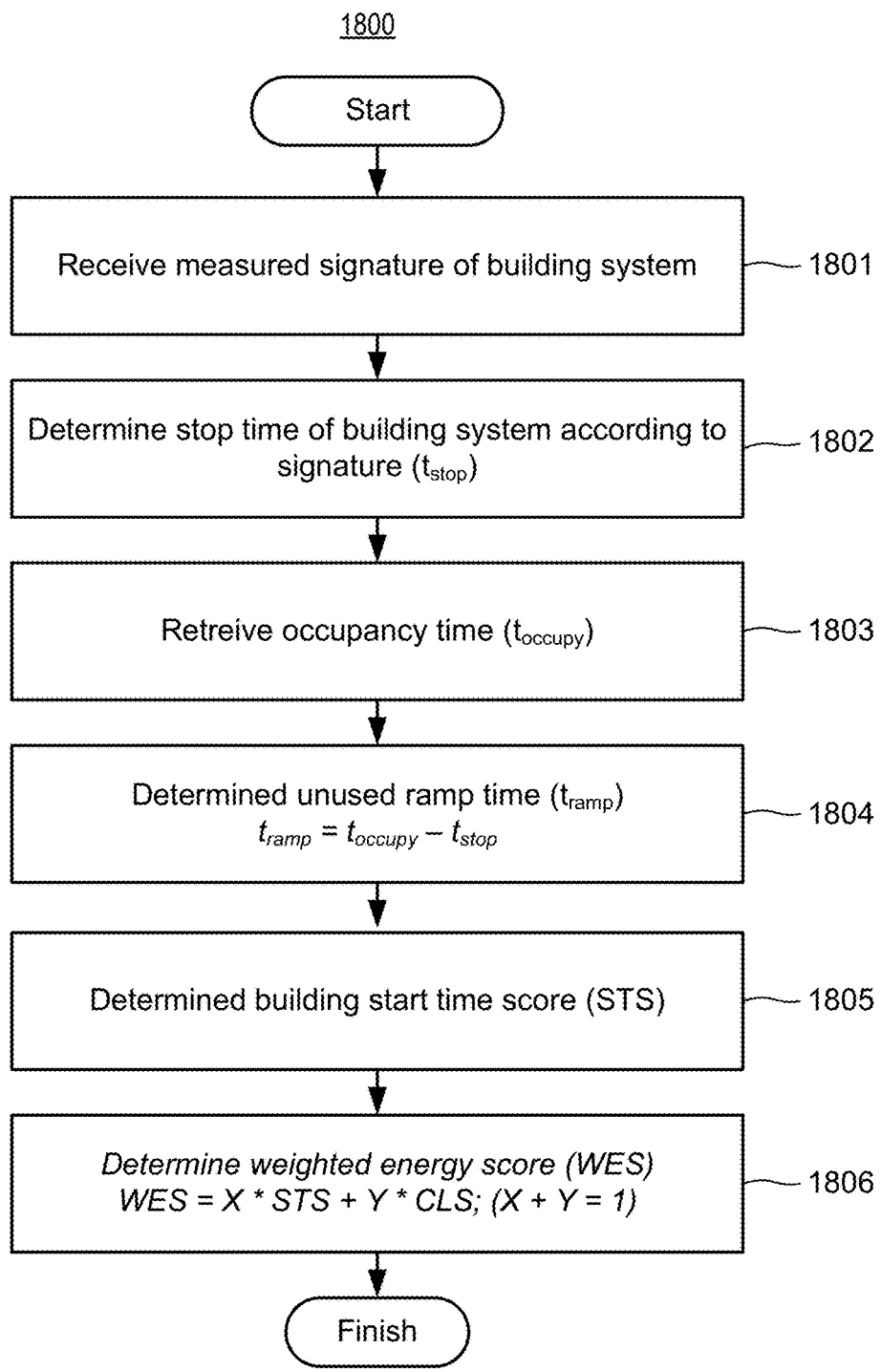
FIG. 18 illustrates a flow diagram of an embodiment for determining an optimal start time for a building system.

FIG. 18 shows an exemplary a process 1800 for determining a building start time score and/or a weighted energy score according to one aspect of the disclosure. In this example, at step 1801, a measured signature of a building system is received. Because one system (e.g., an HVAC system) may comprise the majority of access to a consumable product over a given period of time (e.g., a period of time just before the building occupancy time), at step 1801 a signature for the entire building's access to a consumable product may be received and analyzed. In this example, such an approximation is reasonable because other building systems may only negligibly affect the overall signature curve. Alternatively, using any of the techniques described herein such as pattern matching algorithms and/or artificial intelligence/intelligent agents/learning algorithms at, e.g., a processor in server/workstation 127, a signature for the particular system of interest (e.g., an HVAC system) may be isolated from other systems by analyzing the overall consumption. In this example, at step 1802, the received signature is analyzed in order to determine an approximate stop time of the building system. In some embodiments, the stop time can be approximated as the time when a slope of the signature changes (e.g., becomes negative). At step 1803, in this example, an occupancy time is retrieved. Again, this occupancy time may be variously determined in different embodiments such as user defined and/or according to a commercial lease or the like. At step 1804 of this example, the retrieved occupancy time and determined stop time of the building system may be used to determine an unused ramp time of the building system. The unused ramp time may be variously configured but in this example represents the amount of time ahead of the occupancy time which the building was brought to temperature (e.g., the interval of time between the determined stop time of the building system and the occupancy time of the building). Finally, in step 1805 a building start time score may be determined as illustrated in this example. In some embodiments, the building start time score may be determined by comparing the determined unused ramp time to exemplary ramp times in a lookup table, such as, e.g., the lookup table 1700 illustrated in FIG. 17. In other embodiments, the building start time score may be determined mathematically using, e.g., a system of equations as presented above.

The metrics determined in step 1604 of process 1600 and step 1805 of process 1800 (e.g., the controllable load score and building start time score, respectively) may optionally be combined into a single metric in order to quantify the overall energy performance of a building in step 1806. As presented herein in various examples, this may be variously determined such as a simple average of the determined building start time score and controllable load score (i.e., the sum of the building start time score and the controllable load score divided by two) and/or may be a weighted average of the determined building start time score and controllable load score (i.e., X % of building start time score and Y % of controllable load score, where X+Y=100%).

Figure 7:
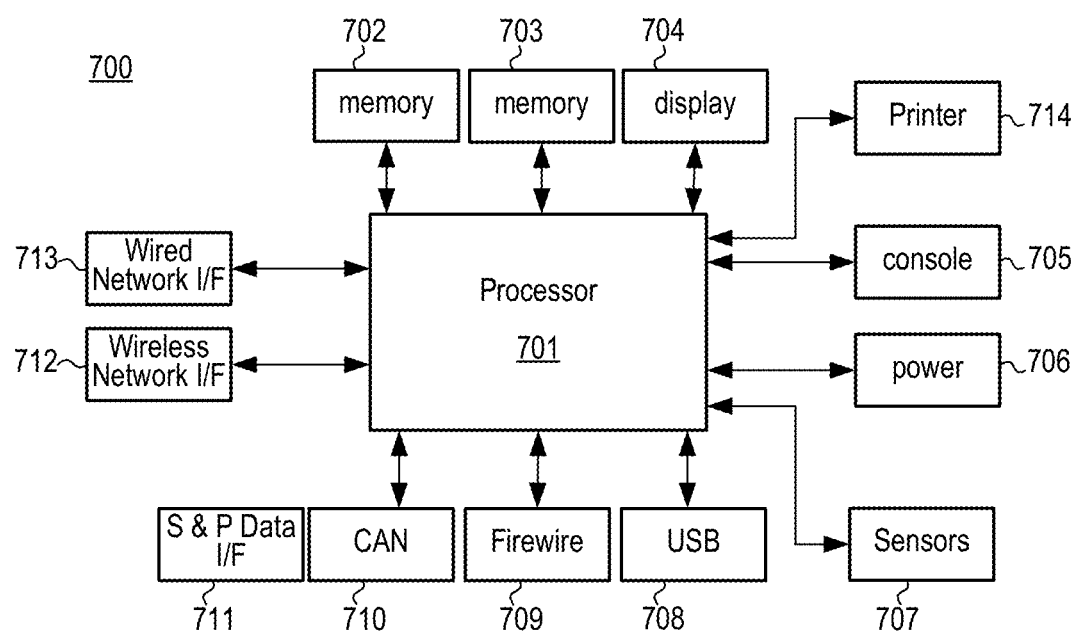
FIG. 7 illustrates a hardware block diagram of a processor according to some embodiments.

FIG. 7 is a block diagram of an exemplary computing platform 700 of various embodiments, including an autonomous processor, meters, sub-meters, communication devices, and other equipment for performing the various described processes. The various embodiments may be implemented as one computing platform or multiple computing platforms, operating independently, or in a coordinated manner, such as in a computer cluster. Using multiple computing platforms may provide redundancy, increased analysis and/or data storage, expanded capability to operate more users and/or geographically disperse users and consumable products, and other advantages.

A processor 701 is configured to perform the various operations of system control, telemetry sensing and gathering, data reception and transmission, sensor calibration and control, consumable product source and load control, telemetry processing. Processor 701 may implement the various algorithms and processes as described herein, including determining heat flow, thermal resistance factors, and thermal mass factors, producing secondary data products such as usage determinations and reports, determining signatures of users and occupants, and determining specific user access to consumable products/energy sources. The algorithms implemented by processor 701 may include pattern matching algorithms, signal processing algorithms, and artificial intelligence algorithms such as neural networks. Processor 701 may further control the operation of other components of computing platform 700 or may control other remote equipment. Processor 701 may include one or more microprocessors, application specific integrated circuits, field programmable gate arrays, programmable interconnect and combinations thereof. Processor 701 may be configured to communicate with and controls the various components within 700 over one or more buses.

In at least some embodiments, processor 701 carries out operations described herein according to machine readable instructions (e.g. software, firmware, hardware configuration files, etc.) stored in memory 702 and/or 703 and/or stored as hardwired logic gates within processor 701. Memory 702 and 703 may further store one or more databases which may be used to store energy conversion factors, occupant heat signatures, consumption signatures of various consumable product users, sensor telemetry, calibration information, control information for various sensors, actuators, and other system components, costing information of various energy sources/consumable products, environmental information, facility information, and other operating conditions. The various databases may permit access by one or more processors in 701 or one or more other processing platforms 700. The various databases may be organized to include meta-data for the various contents to enable selective retrieval of data to enable the processing as described herein. As one example meta-data may be added to consumption data such that it is retrievable from the database in the correct time order, or such that signatures and data specific to certain tenants or areas of the building are provided from the database as a group of data that is easily combinable.

Memory 702 and 703 may include volatile and non-volatile memory and may include any of various types of storage technology, including one or more of the following types of storage devices: read only memory (ROM) modules, random access memory (RAM) modules, magnetic tape, magnetic discs (e.g., a fixed hard disk drive or a removable floppy disk), optical disk (e.g., a CD-ROM disc, a CD-RW disc, a DVD disc), flash memory, and EEPROM memory.

Main processor 701 may be configured to communicate with other computing systems, meters, sub-meters, etc. through various interfaces such as wireless interfaces that may include additional hardware and/or firmware. Such interfaces may include one or more USB interfaces 708, Firewire interfaces 709, CAN protocol or other standard sensor interfaces 710, other serial or parallel data interfaces 711, and/or one or more wired and/or wireless network interfaces 712, 713. For example, communication to remote hardware may be accomplished through public and/or private networks using network interfaces such as wireless interfaces 712, wired interfaces 713, combinations of such interfaces and other equipment. For example, wireless interface 712 may be a local Wi-Fi interface connected through a modem of a land line DSL, Coax, or Fiber-optic service provider network which connects to the Internet. Alternatively, wireless interface 712 may be equipment for connecting to a satellite or a cellular network as commonly used for cell phones, pagers, security systems, and personal digital assistants (PDAs).

For human interaction with the system, computing platform 700 may include a display for presenting a graphical user interface, graphs, charts, configuration information, or other data relating to the embodiments described herein. Computing platform 700 may further include a console 705 for human interaction and control of the various embodiments, and a printer 714 or other output device for generating records such as invoices and usage reports. Such consoles may include keyboards, mice or other input output devices. The display, console, and printer may be co-located with the other components of 700, or may be remote from 700. For example, several of the components of 700 may operate as a server that is remotely accessed over the Internet or private network and which may provide web pages for presenting and interacting with the system.

Computing platform 700 may further include other equipment such as power supply 706, battery backups, fuses or other circuit protection features, finger print readers and other security devices, expansion slots for additional hardware, audio equipment, infrared ports, etc.

The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and their practical application to enable one skilled in the art to utilize the present invention in various embodiments and with various modifications as are suited to the particular use contemplated. The features of the embodiments described herein may be combined in all possible combinations of methods, apparatuses, modules, systems, and machine-readable storage memory. Any and all permutations of features from the above-described embodiments are within the scope of the invention. For example, in performing processes 300, 400, 600, 1000, 1100, 1200, 1500, 1600, and 1800 the various computing platforms performing the processes may perform the various steps in a different order, may combine certain steps from the different processes, or may omit certain steps.

Further, the various embodiments have been described in the context of public utilities such as electricity and gas, and in the context of human occupation. Such embodiments are exemplary only and the principles described herein are equally applicable to other energy sources where the distribution to multiple buildings may be measured and analyzed. Other example include distribution of compressed air, inert gases, steam, ice, dry ice, agricultural irrigation, livestock, domestic animals, geothermal, nuclear, biofuels, biomass, and any other energy source.

I claim:

1. An apparatus comprising one or more processors and memory storing instructions, that when executed by the one or more processors, cause the apparatus to:
    determine a theoretical unoccupied load of a building based on a minimum access to a consumable product during a time interval;
    measure an amount of consumable product accessed by the building during the time interval to determine an unoccupied load of the building;
    measure an amount of sub-metered consumable product accessed by at least one sub-metered user during the time interval to determine a sub-metered load of the building; and
    adjust an building system in response to comparing a sum of the theoretical unoccupied load and the sub-metered load to the unoccupied load.

2. The apparatus of claim 1, wherein adjusting the building system includes reducing access to the consumable product by the building during the time interval.

3. The apparatus of claim 1, wherein the memory further stores instructions, that when executed by the one or more processors, cause the apparatus to:
    determine controllable load score based on the sum of the theoretical unoccupied load and the sub-metered load divided by the unoccupied load, and
    wherein the building system is adjusted based on the controllable load score.

4. The apparatus of claim 1, wherein the theoretical unoccupied load comprises access to the consumable product by one or more emergency lights associated with the building.

5. The apparatus of claim 1, wherein the theoretical unoccupied load comprises access to the consumable product by at least one transformer associated with the building.

* * * * *

UNITED STATES PATENT AND TRADEMARK OFFICE
CERTIFICATE OF CORRECTION

PATENT NO. : 10,452,090 B2  
APPLICATION NO. : 15/258160  
DATED : October 22, 2019  
INVENTOR(S) : Scelzi Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 242 days.

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*